US008778715B2

(12) United States Patent
Bellinger et al.

(10) Patent No.: US 8,778,715 B2
(45) Date of Patent: Jul. 15, 2014

(54) METHOD OF FABRICATING A NEUTRON DETECTOR SUCH AS A MICROSTRUCTURED SEMICONDUCTOR NEUTRON DETECTOR

(71) Applicant: Radiation Detection Technologies, Inc., Manhattan, KS (US)

(72) Inventors: Steven L. Bellinger, Manhattan, KS (US); Ryan G. Fronk, Manhattan, KS (US); Douglas S. McGregor, Riley, KS (US)

(73) Assignee: Radiation Detection Technologies, Inc., Manhattan, KS (US)

( * ) Notice: Subject to any disclaimer, the term of this patent is extended or adjusted under 35 U.S.C. 154(b) by 0 days.

(21) Appl. No.: 13/924,839

(22) Filed: Jun. 24, 2013

(65) Prior Publication Data
US 2013/0344636 A1  Dec. 26, 2013

Related U.S. Application Data

(60) Provisional application No. 61/663,751, filed on Jun. 25, 2012.

(51) Int. Cl.
*H01L 21/00* (2006.01)
*H01L 31/115* (2006.01)
*H01L 31/18* (2006.01)
*B82Y 40/00* (2011.01)

(52) U.S. Cl.
CPC ............. *H01L 31/18* (2013.01); *H01L 31/115* (2013.01); *Y10S 977/89* (2013.01); *H01L 31/1804* (2013.01); *B82Y 40/00* (2013.01); *Y10S 977/773* (2013.01); *Y10S 977/953* (2013.01)

USPC ...... 438/56; 438/700; 257/E21.483; 977/890; 977/773; 977/953

(58) Field of Classification Search
USPC .............................. 438/56, 361; 257/E21.483
See application file for complete search history.

(56) References Cited

U.S. PATENT DOCUMENTS

2012/0132819 A1* 5/2012 Climent .................. 250/370.05

OTHER PUBLICATIONS

W. J. McNeil, S. L. Bellinger et al.; "1-D Array of Micro-Structured Neutron Detectors"; 2009 IEEE Nuclear Science Symposium Conference Record; pp. 2008-2011.
DeLurgio, Patrick M. et al.; "A Neutron Detector to Monitor the Intensity of Transmitted Neutrons for Small-Angle Neutron Scattering Instruments"; Nuclear Instruments and Methods in Physics Research A 505 (2003) pp. 46-49.
Solomon, C.J. et al.; "A Hybrid Method for Coupled Neutron-Ion Transport Calculations for 10B and 6LiF Coated and Perforated Detector Efficiencies"; Nuclear Instruments and Methods in Physics Research A580 (2007) pp. 326-330.

(Continued)

*Primary Examiner* — Cheung Lee
(74) *Attorney, Agent, or Firm* — Brooks Kushman P.C.

(57) ABSTRACT

A method of making a neutron detector such as a microstructured semiconductor neutron detector is provided. The method includes the step of providing a particle-detecting substrate having a surface and a plurality of cavities extending into the substrate from the surface. The method also includes filling the plurality of cavities with a neutron-responsive material. The step of filling including the step of centrifuging nanoparticles of the neutron-responsive material with the substrate for a time and a rotational velocity sufficient to backfill the cavities with the nanoparticles. The material is responsive to neutrons absorbed, thereby, for releasing ionizing radiation reaction products.

24 Claims, 16 Drawing Sheets

(56) References Cited

OTHER PUBLICATIONS

Solomon, C.J. et al.; "Angular Design Considerations for Perforated Semiconductor Detectors"; IEEE Nuclear Science Symposium Conference Record (2007) pp. 1556-1559.
Bellinger, S.L., et al.; "Angular Response of Perforated Silicon Diode High Efficiency Neutron Detectors"; IEEE Nuclear Science Symposium Conference Record (2007) pp. 1904-1907.
McGregor, Douglas, et al.; Bulk GaAs-Based Neutron Detectors for Spent Fuel Analysis; Proceedings of ICONE 8, 8th International Conference on Nuclear Engineering; Apr. 2-6, 2000; pp. 1-8.
Bellinger, S.L., et al.; "Characteristics of the Stacked Microstructured Solid-State Neutron Detector"; S.M.A.R.T. Laboratory, Department of Mechanical and Nuclear Engineering, Kansas State University (2010).
Bellinger, S.L. et al.; "Characteristics of 3D Micro-Structured Semiconductor High Efficiency Neutron Detectors"; IEEE Transactions on Nuclear Science, vol. 56, No. 3, Jun. 2009; pp. 742-746.
Henderson, C.M., et al.; "Characterization of Prototype perforated Semiconductor Neutron Detectors"; Radiation Physics and Chemistry 79 (2010) 144-150.
McGregor, Douglas et al.; "Design Considerations for Thin Film Coated Semiconductor Thermal Neutron Detectors—I: Basics Regarding Alpha Particle Emitting Neutron Reactive Films"; Nuclear Instruments and Methods in Physics Research A 500 (2003) 272-308.
Unruh, Troy C. et al.; "Design and Operation of a 2-D Thin-Film Semiconductor Neutron Detector Array for Use as a Beamport Monitor"; Nuclear Instruments and Methods in Physics Research A; 604 (2009) 150-153.
Shultis, J.K., et al.; "Design and Performance Considerations for Perforated Semiconductor Thermal-Neutron Detectors"; Nuclear Instruments and Methods in Physics Research A; (2009) 608-636.
Klann, Raymond T. et al.; "Development of Coated Gallium Arsenide Neutron Detectors"; Proceedings of ICONE 8; 8th International Conference on Nuclear Engineering Apr. 2-6, 2000; pp. 1-6.
Klann, R. T. et al.; "Development of Semiconductor Detectors for Fast Neutron Radiography"; 2001 American Institute of Physics; pp. 1118-1121.
Shultis, Kenneth J. et al.; "Efficences of Coated and Perforated Semiconductor Neutron Detectors"; IEEE Transactions on Nuclear Science, vol. 53, No. 3, Jun. 2006; pp. 1659-1665.
Shultis, Kenneth J. et al.; "Efficiencies of Coated and Perforated Semiconductor Neutron Detectors"; IEEE (2004) pp. 4569-4574.
Bellinger, S.L. et al.; "Enhanced Variant Designs and Characteristics of the Microstructured Solid-State Neutron Detector"; Nuclear Instruments and Methods in Physics Research A 652 (2011) pp. 387-391.
Bellinger, S.L. et al.; "High Efficiency Dual-Integrated Stacked Microstructured Solid-State Neutron Detectors"; 2010 IEEE Nuclear Science Symposium Conference Record; pp. 2008-2012.
McGregor, Douglas et al.; "Micro-Structured High-Efficiency Semiconductor Neutron Detectors" 2008 IEEE; pp. 446-448.
McGregor, D.S. et al.; "Microstructured Semiconductor Neutron Detectors"; Nuclear Instruments and Methods in Physics Research A 608 (2009) 125-131.
Patterson, Jahan et al.; "Neutron Dosimeters Employing High-Efficiency Perforated Semiconductor Detectors"; Science Director Nuclear Instruments and Methods in Physics Research B 263 (2007) pp. 183-185.
Cooper, Brian W. et al.; "Neutron Energy Spectrum with Microstructured Semiconductor Neutron Detectors": 2011 IEEE Nuclear Science Symposium Conference Record; pp. 4783-4786.
McGregor, Douglas S. et al.; "New Surface Morphology for Low Stress Thin-Film-Coated Thermal Neutron Detectors"; IEE Transactions on Nuclear Science, vol. 49, No. 4, Aug. 2002; pp. 1999-2004.
Britton, J.L. et al.; "PATARA: Solid-State Neutron Detector Readout Electronics with Pole-Zero and Complex Shaping and Gated Baseline Restorer for the SNS"; 2006 IEEE Nuclear Science Symposium Conference Record; pp. 27-31.
McNeil, W.J. et al.; "Perforated Diode Fabrication for Neutron Detection"; 2006 IEEE Nuclear Science Symposium Conference Record; pp. 3732-3735.
McGregor, D.S. et al.; "Perforated Diode Neutron Detector Modules Fabricated from High-Purity Silicon"; Science Direct Radiation Physics and Chemistry 78 (2009) 874-881.
McNeil, W.J. et al.; "Preliminary Tests of a High Efficiency 1-D Silicon Pixel Array for Small Angle Neutron Scattering"; 2007 IEEE Nuclear Science Symposium Conference Record; pp. 2340-2342.
McGregor, D.S. et al.; "Recent Results From Thin-Film-Coated Semiconductor Neutron Detectors"; Proceedings of SPIE vol. 4784 (2002).
Solomon, C.J. et al.; "Reduced Efficiency Variation in Perforated Neutron Detectors with Sinusoidal Trench Design"; Nuclear Instruments and Methods in Physics Research A 618 (2010); pp. 260-265.
McGregor, Douglas S. et al.; "Reporting Detection Efficiency for Semiconductor Neutron Detectors: A Need for a Standard"; Nuclear Instruments and Methods in Physics Research A 632 (2011) 167-174.
McGregor, D.S. et al.; "Self-Biased Boron-10 Coated High-Purity Epitaxial GaAs Thermal Neutron Detectors"; IEEE Transactions on Nuclear Science, vol. 47, No. 4, Aug. 2000.
Bellinger, S.L. et al.; "Characteristics of the Stacked Microstructured Solid-State Neutron Detector"; S.M.A.R.T. Laboratory, Department of Mechanical and Nuclear Engineering, Electronics Design Laboratory, Kansas State University (2010).
Gersch, H.K. et al.; "The Effect of Incremental Gamma-Ray Doses and Incremental Neutron Fluences Upon the performance of Self-Biased 10B-Coated High-Purity Epitaxial GaAs Thermal Neutron Detectors"; Nuclear Instruments and Methods in Physics Research A 489 (2002).
McGregor D.S. et al.; "Thin-Film-Coated Bulk GaAs Detectors for Thermal and Fast Neutron Measurements"; Nuclear Instruments and Methods in Physics Research A 466 (2001) 126-141.
McGregor, D.S. et al.; "Wireless Neutron and Gamma Ray Detector Modules for Dosimetry and Remote Monitoring"; 2007 IEEE Nuclear Science Symposium Conference Record; pp. 808-812.

* cited by examiner

US 8,778,715 B2

METHOD OF FABRICATING A NEUTRON DETECTOR SUCH AS A MICROSTRUCTURED SEMICONDUCTOR NEUTRON DETECTOR

CROSS-REFERENCE TO RELATED APPLICATIONS

This application claims the benefit of U.S. Provisional Application entitled "Semiconductor Process Method for Microstructured Semiconductor Neutron Detector Fabrication" filed Jun. 25, 2012 and having U.S. Ser. No. 61/663,751. That application is hereby incorporated in its entirety by reference herein.

STATEMENT REGARDING FEDERALLY SPONSORED RESEARCH OR DEVELOPMENT

The invention was made with Government support under Contract No. DTRA01-02-D-0067 awarded by the Department of Defense, Defense Threat Reduction Agency. The Government has certain rights to the invention.

BACKGROUND OF INVENTION

1. Field of Invention

This invention relates to processes wherein neutron absorbing material is backfilled into semiconductor cavity regions while maintaining low leakage current of the resulting neutron detectors.

2. Background Art and Description of Related Art

The following references are related to the present invention:

Bellinger, S. L., Advanced Microstructured Semiconductor Neutron Detectors: Design, Fabrication, and Performance, Ph.D. Dissertation, Kansas State University, Manhattan, Kans. (2011).

Bellinger, S. L., R. G. Fronk, W. J. McNeil, T. J. Sobering, and D. S. McGregor, "Enhanced Variant Designs and Characteristics of the Microstructured Solid-State Neutron Detector," Nucl. Instrum. and Meth., A 652 (2011) pp. 387-391.

Bellinger, S. L., R. G. Fronk, W. J. McNeil, T. J. Sobering, D. S. McGregor, "High Efficiency Dual-Integrated Stacked Microstructured Solid-State Neutron Detectors," IEEE Nuclear Science Symposium, Knoxville, Tenn., Oct. 31-Nov. 5, 2010, in press.

Bellinger, S. L., R. G. Fronk, W. J. McNeil, J. K. Shultis, T. J. Sobering, D. S. McGregor, "Characteristics of the Stacked Microstructured Solid-State Neutron Detector," Proc. SPIE, 7805 (2010) 7805-0N.

Bellinger, S. L., W. J. McNeil and D. S. McGregor, "Improved Fabrication Technique for Microstructured Solid-State Neutron Detectors," Proc. MRS, vol. 1164 (2009) L06-01.

Bellinger, S. L., W. J. McNeil, T. C. Unruh, D. S. McGregor, "Characteristics of 3D Micro-Structured Semiconductor High Efficiency Neutron Detectors," IEEE Trans. Nucl. Sci., NS-56 (2009) pp. 742-746.

Bellinger, S. L., W. J. McNeil, D. S. McGregor, "Variant Designs and Characteristics of Improved Microstructured Solid-State Neutron Detectors," IEEE Nuclear Science Symposium, Orlando, Fla., Oct. 25-Oct. 31, 2009, pp. 986-989.

Bellinger, S. L., W. J. McNeil, T. C. Unruh, D. S. McGregor, "Angular Response of Perforated Silicon Diode High Efficiency Neutron Detectors," IEEE Nuclear Science Symposium, Waikiki, Hi., Oct. 28-Nov. 3, 2007.

Bunch, S., J. L., Britton, B. J. Blalock, C. L. Britton, D. S. McGregor, R. Taylor, T. Sobering, D. Huddleston, W. McNeil, T. Unruh, B. B. Rice, S. Bellinger, B. Cooper, L. Crow, "HENDA and Patara: A Solid State Neutron Detector and a Prototype Readout Chip for the SNS", VIth International Meeting on Front End Electronics for High Energy, Nuclear, Medical and Space Applications, 17-20 May 2006, Perugia, Italy.

Cooper, B. W., S. L. Bellinger, A. Caruso, R. G. Fronk, W. H. Miller, T. M. Oakes, J. K. Shultis, T. J. Sobering, D. S. McGregor, "Neutron Energy Spectrum with Micro-structured Semiconductor Neutron Detectors," IEEE NSS Conf. Rec., Valencia, Spain, Oct. 23-29, 2011.

De Lurgio, P. M., R. T. Klann, C. L. Fink, D. S. McGregor, P. Thiyagarajan, I. Naday, "A Neutron Detector to Monitor the Intensity of Transmitted Neutrons for Small-Angle Neutron Scattering Instruments," Nuclear Instruments and Methods, A505 (2003) pp. 46-49.

Dunn, W. L., Q. M. Jahan, D. S. McGregor, W. McNeil, E. L. Patterson, B. Rice, J. K. Shultis, C. J. Solomon, Design and Performance of a Portable Neutron Dosimeter, *Proc. 2nd Workshop on European Collaboration for Higher Education in Nuclear Engineering and Radiological Protection*, 12-15 Mar., 2006, Valencia, Spain, pp. 85-92.

Gersch, H. K., D. S. McGregor, and P. A. Simpson, "A Study of the Effect of Incremental Gamma-Ray Doses and Incremental Neutron Fluences Upon the Performance of Self-Biased $^{10}$B-Coated High-Purity Epitaxial GaAs Thermal Neutron Detectors," Nuclear Instruments and Methods, A489 (2002) pp. 85-98.

Gersch, H. K., D. S. McGregor, and P. A. Simpson, "A Study of the Effect of Incremental Gamma-Ray Doses and Incremental Neutron Fluences Upon the Performance of Self-Biased $^{10}$B-Coated High-Purity Epitaxial GaAs Thermal Neutron Detectors," Conference Record of the IEEE Nuclear Science Symposium, Lyon, France, Oct. 15-20, 2000.

Henderson, C. M., Q. M. Jahan, W. L. Dunn, J. K. Shultis and D. S. McGregor, "Characterization of Prototype Perforated Semiconductor Neutron Detectors," Radiation Physics and Chemistry, 79 (2010) pp. 144-150.

Jahan, Q., E. Patterson, B. Rice, W. L. Dunn and D. S. McGregor, "Neutron Dosimeters Employing High-efficiency Perforated Semiconductor Detectors," Nuc. Instrum. and Meth., B263 (2007) pp. 183-185.

Klann, R. T., Charles L. Fink, Douglas S. McGregor, and Holly K. Gersch, "Development of Coated Gallium-Arsenide for Neutron Detection Applications," Conference Record of the 12$^{th}$ Biennial RPSD Topical Meeting, Sante Fe, N. Mex., Apr. 14-18, 2002.

Klann, R. T., C. L. Fink, D. S. McGregor, and H. K. Gersch, "Development of Semi-Conductor Detectors for Fast Neutron Radiography," Conference Record of the 15th Int. Conf. on Applications of Accelerators in Research and Industry, November, 2000.

Klann, R. T., and D. S. McGregor, "Development of Coated GaAs Neutron Detectors," Conference Record of ICONE-8, 8th International Conference on Nuclear Engineering, Apr. 2-6, 2000, Baltimore, Md. USA.

Lindsay, J. T., C. C. Brannon, D. S. McGregor, and R. W. Olsen, "A Solid State, Position Sensitive GaAs Device as a Neutron Camera," Fifth World Conference on Neutron Radiography, Berlin, Germany, Jun. 17-20, 1996, pp. 240-248.

McGregor, D. S., S. L. Bellinger, W. J. McNeil, E. L. Patterson, B. B. Rice, J. K. Shultis, C. J. Solomon, "Non-Streaming High-Efficiency Perforated Semiconductor Neutron Detectors and Method of Making the Same," U.S. Pat. No. 7,855,372; allowed Dec. 21, 2010.

McGregor, D. S., and R. T. Klann, "Semiconductor Gamma Radiation Detector "High-Efficiency Neutron Detectors and Methods of Making the Same," U.S. Pat. No. 7,164,138; allowed Jan. 16, 2007.

McGregor, D. S., and R. T. Klann, "Pocked Surface Neutron Detector," U.S. Pat. No. 6,545,281; allowed Apr. 8, 2003.

McGregor, D. S., J. K. Shultis, "Reporting Detection Efficiency for Semiconductor Neutron Detectors; a Need for a Standard," Nucl. Instrum. and Meth., A632 (2011) pp. 167-174.

McGregor, D. S., W. J. McNeil, S. L. Bellinger, T. C. Unruh, J. K. Shultis, "Microstructured Semiconductor Neutron Detectors," Nucl. Instrum. and Meth. A608 (2009) pp. 125-131.

McGregor, D. S., S. Bellinger, D. Bruno, W. L. Dunn, W. J. McNeil, E. Patterson, B. B. Rice, J. K. Shultis, T. Unruh, "Perforated Diode Neutron Detector Modules Fabricated from High-Purity Silicon," Radiation Physics and Chemistry, 78 (2009) pp. 874-881.

McGregor, D. S., S. L. Bellinger, W. J. McNeil, T. C. Unruh, "Micro-Structured High-Efficiency Semiconductor Neutron Detectors," IEEE Nuclear Science Symposium, Dresden, Germany, Oct. 19-Oct. 25, 2008.

McGregor, D. S., S. L. Bellinger, D. Bruno, S. Cowley, W. L. Dunn, M. Elazegui, W. J. McNeil, H. Oyenan, E. Patterson, J. K. Shultis, G. Singh, C. J. Solomon, A. Kargar, T. Unruh, "Wireless Neutron and Gamma Ray Detector Modules for Dosimetry and Remote Monitoring," IEEE Nuclear Science Symposium, Waikiki, Hi., Oct. 28-Nov. 3, 2007.

McGregor, D. S., S. L. Bellinger, D. Bruno, W. J. McNeil, E. Patterson, J. K. Shultis, C. J. Solomon, T. Unruh, "Perforated Semiconductor Neutron Detectors for Battery Operated Portable Modules," Proc. SPIE, 6706 (2007) pp. 0N1-0N12.

McGregor, D. S., S. L. Bellinger, D. Bruno, S. Cowley, M. Elazegui, W. J. McNeil, E. Patterson, B. B. Rice, C. J. Solomon, J. K. Shultis, and T. Unruh, "Perforated Semiconductor Neutron Detector Modules for Detection of Spontaneous Fission Neutrons," IEEE Conference on Technologies for Homeland Security, Woburn, Mass., May 16-17, 2007.

McGregor, D. S., S. Bellinger, D. Bruno, W. J. McNeil, E. Patterson, B. B. Rice, "Perforated Semiconductor Neutron Detector Modules," Proc. of 32nd Annual GOMACTech Conf., Lake Buena Vista, Fla., Mar. 19-22, 2007.

McGregor, D. S., et al., "Perforated Semiconductor Diodes for High Efficiency Solid State Neutron Detectors," presentation recorded in the conference record of the Workshop on Use of Monte Carlo Techniques for Design and Analysis of Radiation Detectors, Coimbra, Portugal, Sep. 15-17, 2006.

McGregor, D. S., M. D. Hammig, H. K. Gersch, Y-H. Yang, and R. T. Klann, "Design Considerations for Thin Film Coated Semiconductor Thermal Neutron Detectors, Part I: Basics Regarding Alpha Particle Emitting Neutron Reactive Films," Nuclear Instruments and Methods, A500 (2003) pp. 272-308.

McGregor, D. S., R. T. Klann, J. D. Sanders, J. T. Lindsay, K. J. Linden, H. K. Gersch, P. M. De Lurgio, C. L. Fink, and Elsa Ariesanti, "Recent Results From Thin-Film-Coated Semiconductor Neutron Detectors," Proc. of SPIE, Vol. 4784 (2002) pp. 164-182.

McGregor, D. S., R. T. Klann, H. K. Gersch, E. Ariesanti, J. D. Sanders, and B. VanDerElzen, "New Surface Morphology for Low Stress Thin-Film-Coated Thermal Neutron Detectors," IEEE Trans. Nuclear Science, NS-49 (2002) pg. 1999-2004.

McGregor, D. S., H. K. Gersch, J. D. Sanders, R. T. Klann, and J. T. Lindsay, "Thin-Film-Coated Detectors for Neutron Detection," Journal of the Korean Association for Radiation Protection, 26 (2001) pp. 167-175.

McGregor, D. S., R. T. Klann, H. K. Gersch, and Y-H. Yang, "Thin-Film-Coated Bulk GaAs Detectors for Thermal and Fast Neutron Measurements," Nuclear Instruments and Methods, A466 (2001) pp. 126-141.

McGregor, D. S., H. K. Gersch, J. D. Sanders, and R. T. Klann, "Designs for Thin-Film-Coated Semiconductor Neutron Detectors," Conference Record of the IEEE Nuclear Science Symposium, San Diego, Calif., Nov. 4-9, 2001.

McGregor, D. S., R. T. Klann, H. K. Gersch, E. Ariesanti, J. D. Sanders, and B. VanDerElzen, "New Surface Morphology for Low Stress Thin-Film-Coated Thermal Neutron Detectors," Conference Record of the IEEE Nuclear Science Symposium, San Diego, Calif., Nov. 4-9, 2001.

McGregor, D. S., H. K. Gersch, J. D. Sanders, R. T. Klann, and J. T. Lindsay, "Thin-Film-Coated Detectors for Neutron Detection," Conference Record of the First iTRS International Symposium On Radiation Safety and Detection Technology, Seoul, Korea, Jul. 18-19, 2001.

McGregor, D. S., S. M. Vernon, H. K. Gersch, S. M. Markham, S. J. Wojtczuk and D. K. Wehe, "Self-Biased Boron-10 Coated High Purity Epitaxial GaAs Thermal Neutron Detectors," IEEE Trans. Nuclear Science, NS-47 (2000) pp. 1364-1370.

McGregor, D. S., J. T. Lindsay, Y-H. Yang, and J. C. Lee, "Bulk GaAs-Based Neutron Detectors for Spent Fuel Analysis," Conference Record of ICONE-8, 8th International Conference on Nuclear Engineering, Apr. 2-6, 2000, Baltimore, Md. USA.

McGregor, D. S., S. M. Vernon, H. K. Gersch and D. K. Wehe, "Self-Biased Boron-10 Coated High Purity Epitaxial GaAs Thermal Neutron Detectors," Conference Record of IEEE Nuclear Science Symposium, Seattle, Wash., Oct. 25-29, 1999.

McGregor, D. S., J. T. Lindsay, C. C. Brannon, and R. W. Olsen, "Semi-Insulating Bulk GaAs as a Semiconductor Thermal-Neutron Imaging Device," Nuclear Instruments and Methods, A380 (1996) pp. 271-275.

McGregor, D. S., J. T. Lindsay, C. C. Brannon, and R. W. Olsen, "Semi-Insulating Bulk GaAs Thermal Neutron Imaging Arrays," IEEE Trans. Nuclear Science, 43 (1996) pp. 1358-1364.

McGregor, D. S., J. T. Lindsay, C. C. Brannon, and R. W. Olsen, "Semi-Insulating Bulk GaAs Thermal Neutron Imaging Arrays," Conference Record of the IEEE Nuclear Science Symposium, San Francisco, Calif., Oct. 21-28, 1995, pp. 395-399.

McNeil, W. J., S. L. Bellinger, T. C. Unruh, C. M. Henderson, P. Ugorowski, B. Morris-Lee, R. D. Taylor, D. S. McGregor, "1-D Array of Perforated Diode Neutron Detectors," Nucl. Instrum. Meth., A604 (2009) pp. 127-129.

McNeil, W. J., S. L. Bellinger, T. C. Unruh, C. M. Henderson, P. B. Ugorowski, W. L. Dunn, R. D. Taylor, B. J. Blalock, C. L. Britton, D. S. McGregor, "1024-Channel Solid State 1-D Pixel Array for Small Angle Neutron Scattering," IEEE Nuclear Science Symposium, Orlando, Fla., Oct. 25-Oct. 31, 2009, pp. 2008-2011.

McNeil, W. J., S. L. Bellinger, B. J. Blalock, C. L. Britton Jr., J. L. Britton, S. C. Bunch, W. L. Dunn, C. M. Henderson, T. J. Sobering, R. D. Taylor, T. C. Unruh, D. S. McGregor, "Preliminary Tests of a High Efficiency 1-D Silicon Pixel Array for Small Angle Neutron Scattering," IEEE Nuclear Science Symposium, Waikiki, Hi., Oct. 28-Nov. 3, 2007.

McNeil, W. J., S. Bellinger, T. Unruh, E. Patterson, A. Egley, D. Bruno, M. Elazegui, A. Streit, D. S. McGregor, "Development of Perforated Si Diodes for Neutron Detection," IEEE Nuclear Science Symposium, San Diego, Calif., Oct. 29-Nov. 3, 2006.

Sanders, J. D., J. T. Lindsay, and D. S. McGregor, "Development of a GaAs-Based Neutron Tomography System for the Assay of Nuclear Fuel," Conference Record of the IEEE Nuclear Science Symposium, San Diego, Calif., Nov. 4-9, 2001.

Shultis, J. K., and D. S. McGregor, "Design and Performance Considerations for Perforated Semiconductor Thermal-Neutron Detectors," Nuclear Instruments and Methods, A606 (2009) pp. 608-636.

Shultis, J. K., and D. S. McGregor, "Designs for Micro-Structured Semiconductor Neutron Detectors," Proc. SPIE, Vol. 7079 (2008) pp. 06:1-06:15.

Shultis, J. K., and D. S. McGregor, "Efficiencies of Coated and Perforated Semiconductor Neutron Detectors," IEEE Trans. Nuclear Science, NS-53 (2006) pp. 1659-1665.

Shultis, J. K., and D. S. McGregor, "Efficiencies of Coated and Perforated Semiconductor Neutron Detectors," Conf. Rec. IEEE Nuclear Science Symposium, Rome, Italy, Oct. 18-22, 2004.

Solomon, C. J., J. K. Shultis, D. S. McGregor, "Reduced Efficiency Variation in Perforated Neutron Detectors with Sinusoidal Trench Design," Nucl. Instrum. and Meth., A618 (2010) pp. 260-265.

Solomon, C. J., J. K. Shultis, W. J. McNeil, T. C. Unruh, B. B. Rice, and D. S. McGregor, "A Hybrid Method for Coupled Neutron-Ion Transport Calculations for $^{10}$B and $^{6}$LiF Coated and Perforated Detector Efficiencies," Nucl. Instrum. and Meth., A580 (2007) pp. 326-330.

Solomon, C. J., J. K. Shultis, D. S. McGregor, "Angular Efficiency Design Considerations for Perforated Semiconductor Neutron Detectors," IEEE Nuclear Science Symposium, Waikiki, Hi., Oct. 28-Nov. 3, 2007.

Unruh, T. C., S. L. Bellinger, D. E. Huddleston, W. J. McNeil, E. Patterson, T. Sobering, R. D. Taylor, D. S. McGregor, "Design and Operation of a 2D Thin Film Semiconductor Neutron Detector Array for use as a Beamport Monitor," Nucl. Instrum. Meth., A604 (2009) pp. 150-153.

Neutron detectors manufactured from semiconductor materials can be classified into two subcategories, those being semiconductor neutron detectors fabricated as rectifying diodes with a neutron reactive coating applied to them, and semiconductor materials that are composed, at least partially, of neutron reactive materials. The former classification is often referred as "coated" or "foil" semiconductor neutron detectors, and the latter classification is often referred to as "solid-form" or "bulk" semiconductor neutron detectors. The present application describes at least one embodiment of an invention within the former classification of semiconductor neutron detectors, in which a neutron reactive material is applied adjacent to a semiconductor rectifying junction.

For the purpose of semiconductor neutron detectors, the most commonly used neutron reactive materials are boron-10 ($^{10}$B) and lithium-6 ($^{6}$Li). Although elemental boron can be used, enriched $^{10}$B is commonly used to increase the efficiency to maximum. Similarly, it is enriched $^{6}$Li that is used rather than elemental Li. Boron and lithium materials used for neutron detection are typically enriched to isotopic concentrations exceeding 95%. The $^{10}$B reaction of interest is $^{10}$B(n,$\alpha$)$^{7}$Li, where 94% of the reactions release a 1.47 MeV alpha particle and a 0.84 MeV $^{7}$Li ion in the excited state, thereafter rapidly de-exciting by the release of a 480 keV gamma ray. Typically, the 480 keV gamma ray does not participate in the detection process because it easily escapes the semiconductor substrate and is not absorbed. The remaining 6% of the reactions release a 1.78 MeV alpha particle and a 1.02 MeV $^{7}$Li ion. The energetic particles are easily detected, provided that they reach the semiconductor substrate before losing too much energy traveling through the neutron absorbing coating or detector electrical contact. The $^{6}$Li reaction of interest is $^{6}$Li(n,t)$^{4}$He, where the reactions release a 2.73 MeV triton and a 2.05 MeV $^{4}$He ion. As with $^{10}$B, the energetic particles from the $^{6}$Li(n,t)$^{4}$He reaction are easily detected, provided that they reach the semiconductor substrate before losing too much energy in the neutron absorbing coating or detector electrical contact.

A single neutron detector coated with $^{10}$B has a maximum theoretical intrinsic thermal neutron (2200 m s$^{-1}$) detection efficiency of approximately 5%, but is generally measured to be lower than 5% due to electronic noise and reaction product energy attenuation through the electrical contacts. Pure $^{6}$Li metal foils applied to a semiconductor diode can yield intrinsic thermal neutron detection efficiencies as high as 12%; however, Li metal is highly reactive and tends to decompose except when treated with stringent encapsulation precautions. For this reason, it is the stable compound $^{6}$LiF that is generally used for with coated neutron detectors. Semiconductor diode detectors coated with $^{6}$LiF can achieve intrinsic thermal neutron detection efficiencies up to approximately 5.2%, similar to that of $^{10}$B-coated devices.

The most common material used for neutron detection is $^{3}$He, a rare and expensive isotope of helium gas. These $^{3}$He gas-filled detectors are typically pressurized to achieve intrinsic thermal neutron detection efficiencies greater than 75%. However, these $^{3}$He gas-filled detectors generally require between 500 volts to 3000 volts to operate, compared to only a few volts needed for semiconductor detectors. Because of their relatively high efficiency, $^{3}$He gas-filled detectors remain the preferred choice for neutron radiation detection.

Over the past decade, between 2001 and 2013, a variation on the coated semiconductor neutron detector has allowed for a ten times increase in efficiency over typical coated semiconductor neutron detectors. These new detectors have microscopic structures etched into the substrate. The microstructures then have a pn junction formed on the reticulated surface, or upon the planar surfaces of the semiconductor substrate. Afterwards, $^{6}$LiF is backfilled into the cavities of the microstructures. Theoretical calculations indicate that intrinsic thermal neutron detection efficiencies over 35% can be achieved with these detectors, and when two are sandwiched together, thermal neutron detection efficiencies greater than 60% can be achieved. Coupled with the fact that they require less than 5 volts to operate, these detectors have achieved recognition as a promising alternative to $^{3}$He gas-filled neutron detectors. Commercialization depends strongly upon a reliable fabrication process that allows for the cavities to be etched such that leakage current is low, and that allows for a non-destructive method to backfill the cavities, while allowing the detectors to be mass produced.

Microstructured semiconductor neutron detectors (MSNDs) are used in neutron detection because of their high detection efficiency and their low power requirements. Trench cavity structures are etched into a semiconductor substrate and then are backfilled with a neutron conversion material that absorbs a neutron and emits charged-particle reaction products. The reaction products enter into the adjacent semiconductor material are subsequently sensed by the semiconductor detector device. The trenches of the devices are high-aspect ratio trenches, generally on the order of 20 micrometers wide by 400 micrometers deep and span the length of the detector diode. Because of this high-aspect ratio requirement of the devices, several difficulties arise regarding the backfilling of neutron reactive materials into the microscopic cavities. An efficient method to backfill these cavities with neutron reactive material is described as part of a preferred embodiment of the present invention.

The first microstructured detectors were fabricated with dry etching techniques, either with capacitive plasma etching systems or inductively coupled plasma etching systems. The inductively coupled plasma etching systems achieve much higher etching rates, as much as 100 microns of etched material per hour, yet even this rate is much too slow for mass production. First, a reaction chamber is limited in capacity, thereby, limiting the throughput of semiconductor substrates per system. Second, the etch rate of 100 microns per hour would require several hours of etching to achieve the required depths needed for microstructured devices backfilled with LiF, typically 400 microns or more. Further, because of the extensive reactor use per etching process, the inductively coupled plasma system must undergo frequent cleaning, thereby, increasing the system down time. It was also learned that the plasma etch process causes damage on the etched surfaces, which manifests as severe leakage current, thereby, reducing the signal to noise ratio of the radiation detectors.

The first silicon-based microstructured semiconductor neutron detectors were fabricated by first making a planar pn diode on the silicon surface. The substrate was often n-type material, upon which a p-type rectifying contact was produced. Afterwards, plasma etched features were cut directly through the pn junction. This process resulted in noisy devices with high leakage current, mainly because of damage caused at the pn junction interface during the plasma etching process.

The second variation of such detectors were manufactured such that the plasma etch did not affect the pn junction, but instead the etched region was recessed away from the pn junction. The leakage current improved significantly, by two orders of magnitude, yet was still too high for practical use.

A third variation of the detectors incorporated the same recessed method as the second method, but an insulating silicon dioxide insulating dielectric was grown inside the etched features in order to remove damaged material and process an electrical insulating layer. This added insulator step improved the devices such that the leakage current was acceptably low, and practical devices could be made. However the leakage current was still higher, by an order of magnitude, than observed for a common Si pn junction diode.

Many methods were used to backfill the etched cavities with LiF material, including physical vapor deposition, ultrasonic vibration, powder compression, flash melting and low pressure condensation. These backfilling methods worked to some amount of success, but had many drawbacks and were time consuming; hence these prior art backfilling methods were not conducive to large scale mass production of the detectors.

$^6$LiF powder is used as the neutron conversion material for most functional MSND devices. Laboratory precipitated and commercially available $^6$LiF powder is composed of large, micron-sized, cubic crystals as shown in FIG. 1. This large crystal size can cause problems when attempting to backfill the device trenches. Often, the large crystals can block portions of the cavity and prevent it from being completely filled with neutron conversion material, thereby, reducing overall neutron detection efficiency. Examples of inefficient backfilling in the cavities are shown in FIG. 2 and FIG. 3. It is important to reduce individual particle size of the LiF material. Particle size was significantly reduced (see FIG. 4 and FIG. 15) by using a vapor condensation method, as shown in FIG. 16, FIG. 17, and FIG. 18.

Referring to FIG. 1, there is shown LiF crystals formed through a titration process whereupon HF is titrated into a saturated solution of LiOH. The microscopic crystals can be of dimensions generally ranging from submicron to tens of microns. These relatively larger micron range crystal sizes do not pack well into the etched cavity regions of the substrate.

Referring to FIG. 2, there is shown LiF crystals formed through HF titration into LiOH forced into the microscopic etched regions that are 250 microns deep. The result is inefficient packing of material into the substrate, thereby, leaving behind much void space and decreasing the amount of the neutron interactive material per unit volume. The end result is lower neutron detection efficiency than optimum.

Referring to FIG. 3, there is shown a cross section of LiF crystals formed through HF titration into LiOH forced into the microscopic etched regions that are 212 microns deep. The result is inefficient packing of material into the substrate, thereby, leaving behind much void space and decreasing the amount of the neutron interactive material. The end result is lower neutron detection efficiency than optimum.

Referring now to FIG. 4, there is shown LiF nanoparticle material produced through the vapor condensation method. The nanoparticle material can pack efficiently into the etched cavity regions. However, the material can agglomerate into large particles that do not pack well into the cavities.

Referring now to FIG. 5, there is shown fractals of agglomerated nanoparticles of LiF produced through vapor condensation. The nanoparticle material has collected into a series of small spheres through electrostatic forces and then the agglomerated spheres form into fractals of varying dimension.

The following U. S. patent documents are related to the present invention: U.S. Pat. Nos. 4,544,576; 6,545,281; 7,164,138; 7,452,568; 7,855,372 and 2006/0177568.

SUMMARY OF THE INVENTION

An object of at least one embodiment of the present invention is to provide an improved method of making neutron detectors such as microstructured semiconductor neutron detectors.

In carrying out the above object and other objects of at least one embodiment of the present invention, the method includes the step of providing a particle-detecting substrate having a surface and a plurality of cavities extending into the substrate from the surface; the method also includes filling the plurality of cavities with a neutron-responsive material. The step of filling including the step of centrifuging nanoparticles of the neutron-responsive material with the substrate for a time and at a rotational velocity sufficient to backfill the cavities with the nanoparticles. The material is responsive to neutrons absorbed thereby for releasing ionizing radiation reaction products.

The step of providing may include the step of forming a dielectric layer and a patterned hard mask layer sequentially on the substrate.

The step of providing may include the step of removing a portion of the dielectric layer with an etch to form an opening to expose the substrate.

The step of providing may include the step of submerging the substrate into a highly anisotropic directionally orientated, semiconductor etching solution to produce the cavities.

The step of providing may include the step of removing residual etchant material from the substrate to eliminate contamination of the semiconductor.

The step of providing may include the step of introducing dopant impurities into the cavities to produce a rectifying junction in the cavities.

The junction may be a pn junction.

The junction may be a Schottky barrier junction.

The junction may be an ohmic contact junction.

The substrate may be a semiconductor substrate. The detector may be a microstructured semiconductor neutron detector. The nanoparticles may be suspended in a colloidal solution during the step of centrifuging.

The cavities may be deep anisotropic cavities.

At least one embodiment of the present invention provides a semiconductor process in which the possibility of producing an electrical leakage current is reduced and the performance of the device is enhanced.

Further, at least one embodiment of the present invention provides a semiconductor process in which a neutron reactive material is backfilled into cavities and the performance of the device is enhanced.

At least one embodiment of the present invention is a semiconductor process. First, a (110) surface-oriented substrate having a thick encapsulating dielectric layer (~3 micrometers) is provided. Thereafter, a diffusion pattern is applied to the substrate with a photoresist such that the pattern aligns with a (111) Si lattice direction of the substrate. Afterwards, the wafer is submerged into a solution of buffered oxide etch (BOE), or other hydrofluoric acid solution, to etch back 7500 angstroms of the dielectric layer. A second pattern used for defining deep etching is applied, also aligned with the (111) direction as before, and BOE, or HF, is used to etch completely through the oxide to the substrate. The substrate is subsequently cleaned with an $O_2$ plasma and/or a photoresist solvent to remove photoresist. The wafer is submerged in a solution of potassium hydroxide (KOH) and features are etched into the substrate up to 475 microns deep. Afterwards, the second mask oxide pattern is removed in a solution of BOE, leaving behind 7500 angstroms of dielectric to act as the diode parameter mask on the substrate. Afterwards, a diffused pn junction is formed in the etched features, or around the etched patterns. After removal of the surface oxides, a pattern of metal can be then applied around the periphery of each detector die, but is not always necessary, as the metal trace is related to a large (greater than 4 $cm^2$) diode size or necessitating connection paths to diodes across a full wafer. Afterwards, another metal pattern is applied to the backside of the wafer. The wafer is placed in a container of colloidal solution composed of, at least partly, LiF, hydrogen peroxide ($H_2O_2$) and methyl alcohol, and the container is centrifuged to force the LiF into the etched features. A final layer of LiF can be evaporated over the detector die.

Some nano-sized material is produced during the conventional manufacturing process, but it is often in low quantities and has proven difficult to recover. A new "bottom up" type process has been developed that utilizes the instability in phase formation and nucleates nanomaterial after the primary material has been formed. Coarse LiF powder is reduced to nanoparticle powder through a vapor transport method. Through this method, further described as a preferred embodiment of the present invention, nanoparticle LiF can be produced in batch quantities of several grams per batch utilizing a Thermal Vaporization Condensation (TVC) system.

At least one embodiment of the invention is a process that allows for rapid deep etching of the semiconductor substrate followed by a process that significantly reduces leakage current from previous methods, coupled to a low-impact method of backfilling the etched cavity regions with LiF material. The process is an advancement on the coated neutron detector fabrication process and allows for both high intrinsic thermal neutron detection efficiency and low leakage-current during operation.

Further described is a process to completely and efficiently backfill microstructured semiconductor cavities with neutron reactive powder for use in neutron detection. $^6$LiF neutron reactive powder is nano-sized using a thermal evaporation process and carrier gas to transport vaporized $^6$LiF to a thermophoretic and/or an electrostatic precipitator device where the vapor condenses and is collected in powder form. The powder is then harvested and evenly suspended into a colloidal solution of alcohol by way of ultrasonic vibration. The microstructured device to be backfilled is placed into the $^6$LiF-alcohol colloid solution and is supported by an aluminum holder. The colloidal solution, with the microstructured device, is then centrifuged. The $^6$LiF powder, previously suspended in the colloid solution, is forced into the cavities with uniform and entirely vertical force much greater than that obtained when filling devices by hand. This process is continued until the trenches are completely filled with neutron reactive material and a thin cap-layer of neutron reactive material is present on the device. The device is then harvested from the alcohol solution and any residual $^6$LiF remaining in the container can be re-suspended into the isopropanol by ultrasonic vibration.

In order to make the aforementioned and other objects, features and advantages of the present invention comprehensible, a preferred embodiment accompanied with figures is described in detail below.

Other objects of the invention will be apparent from the following description and drawings.

DETAILED DESCRIPTION OF THE PREFERRED EMBODIMENTS

The present invention will now be described more specifically with reference to the following embodiments. It is to be noted that the following descriptions of preferred embodiments of this invention are presented herein for the purpose of illustration and description only. It is not intended to be exhaustive or to be limited to the precise form disclosed.

FIGS. 6 to 14, and FIG. 21, and FIG. 30 schematically illustrate cross-section views of a semiconductor process according to an embodiment of the present invention.

Figure 6:
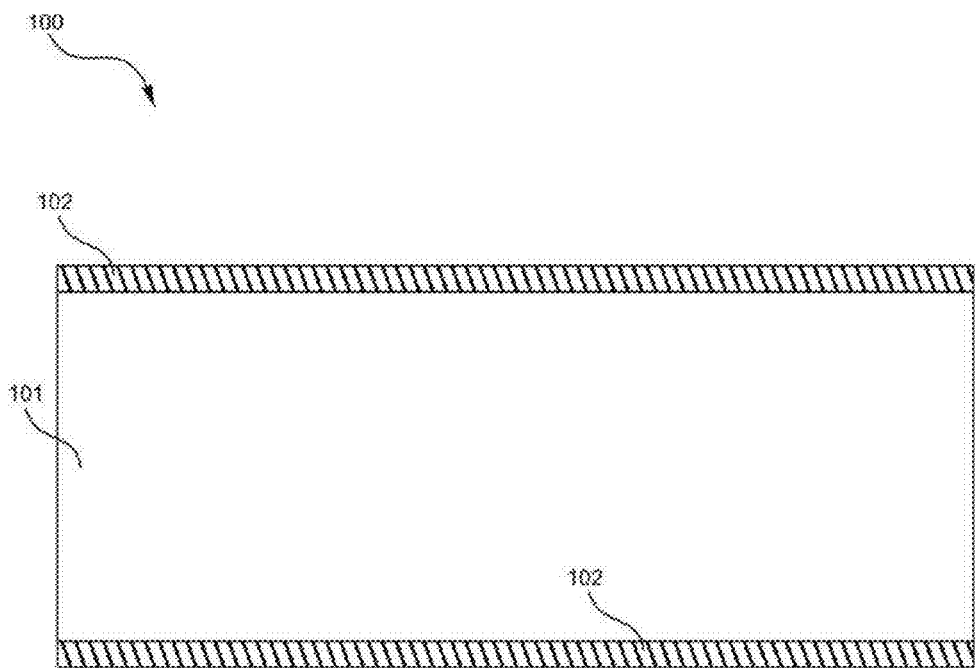
FIGS. 6-14 schematically illustrate cross-section views of a semiconductor process according to an embodiment of the present invention.

Referring to FIG. 6, generally describing an embodiment of the present invention 100, a substrate 101 having a thick dielectric coating 102 thereon is provided. The substrate 101 may be an n-type doped silicon substrate, a p-type doped silicon substrate, a low-doped n-type float zone refined silicon substrate, a low-doped p-type float zone refined silicon substrate, an epitaxial silicon substrate, a gallium arsenide (GaAs) substrate, a gallium phosphide (GaP) substrate, a gallium nitride (GaN) substrate, an indium phosphide (InP) substrate, a silicon carbide (SiC) substrate, a silicon germanium (SiGe) substrate, or other semiconductor. The substrate 101 may have a crystal orientation [110]. The substrate 101 may be generally between 300 microns to 1100 microns in thickness. The substrate 101 may have a primary flat orientation on a [111] crystal plane direction and a secondary flat orientation [111] 70.53 degrees rotated off the primary flat orientation. The insulating dielectric layer 102 may be a silicon dioxide layer ($SiO_2$), or a silicon nitride ($Si_3N_4$) layer. The dielectric layer 102 encapsulates both sides of the substrate 101. The dielectric layer 102 can be a thick layer in the approximate range between 1 microns to 3 microns thick.

Figure 7:
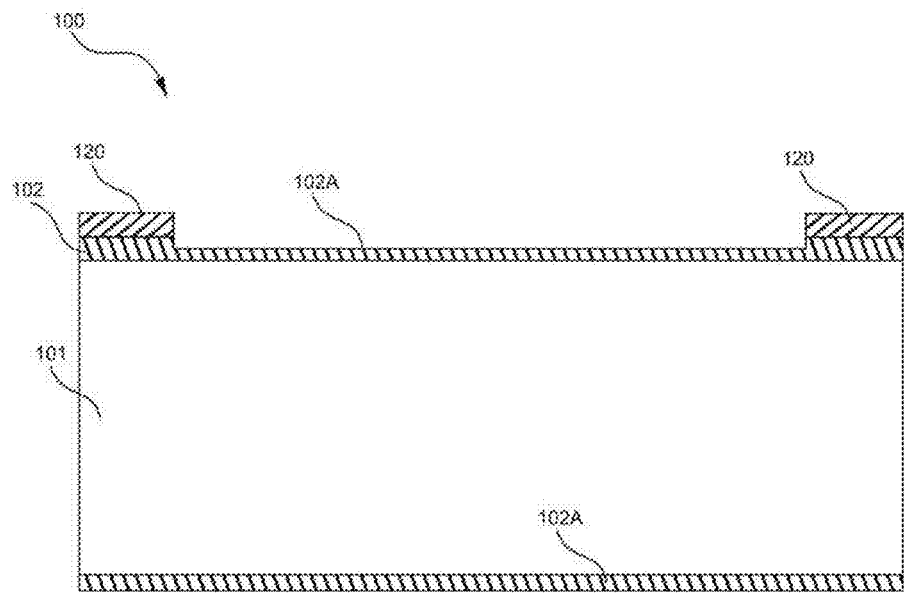

Referring to FIG. 7, a mask 120 is applied to the front side of the substrate 101 and developed to form a pattern to produce a window atop the dielectric layer 102. The mask 120 may be formed by negative photoresist, or the mask 120 may be formed by positive photoresist. The pattern may be generally aligned along a [111] crystal flat orientation of the substrate 101. Afterwards, the mask 120 is hardened. The substrate 101 is submerged in an etching solution to perform an etching process to remove, partially, an exposed region of the dielectric layer 102 to a thinned dielectric layer represented as 102A. The dielectric layer 102 on the backside of the substrate 101 is also etched during this same process to new thickness 102A. The etching solution may be a solution of buffered oxide etch (BOE), or the etching solution may be a solution of hydrofluoric acid (HF), or the etching solution may be phosphoric acid. The remaining dielectric layer thickness 102A may be in the range between 1 microns to 2 microns thick.

Figure 8:
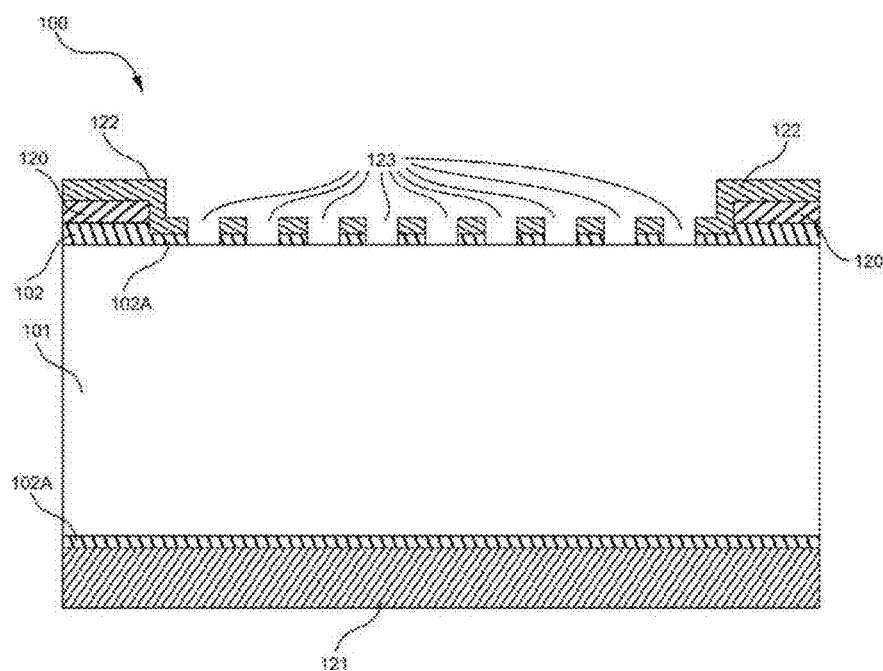

Referring to FIG. 8, a thick mask 121 is applied to the back side of substrate 101. The mask 121 may be formed by negative photoresist, or the mask 121 may be formed by positive photoresist. The mask 121 is cured and hardened. Afterwards, a thin mask 122 is applied to the front side of the substrate 101. The thin mask 122 may be formed by negative photoresist, or the thin mask 122 may be formed by positive photoresist. A pattern of openings is developed through mask 122 atop dielectric layer 102A. The patterns may be generally aligned along a [111] crystal flat orientation of the substrate 101 such that the pattern is generally aligned with the <111> crystal planes. The thin mask 122 is cured and hardened. The substrate 101 is submerged in an etching solution to transfer the mask 122 pattern to the substrate 101 and remove the dielectric material 102A to produce exposed regions 123 on substrate 101. The etching solution may be a solution of buffered oxide etch (BOE), or the etching solution may be a solution of hydrofluoric acid (HF), or the etching solution may be phosphoric acid. Afterwards, the mask 121 and mask 122 and mask 120 are removed from the substrate 101. The mask removal process may include a liquid chemical mask remover. The substrate 101 may then be cleaned in a gaseous plasma. For instance, the substrate 101 may be cleaned in an $O_2$ plasma for a duration between 30 minutes to 90 minutes.

Figure 9:
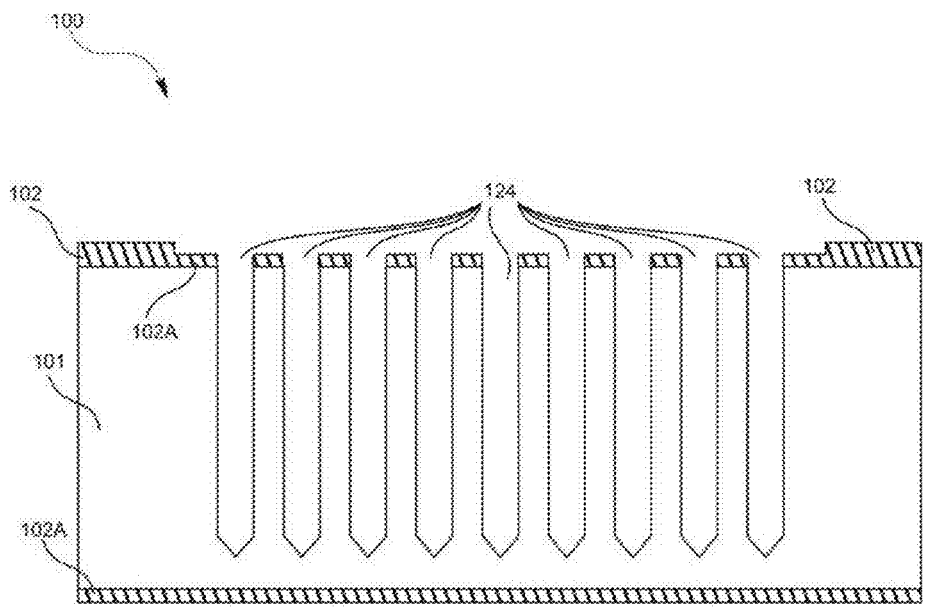

Referring to FIG. 9, the substrate 101 is submerged in an etching solution to etch deep features 124 in substrate 101. The etching solution may be an aqueous solution of potassium hydroxide (KOH), or the etching may be performed with a deep reactive-ion etching (DRIE) plasma. The substrate is etched to produce features 124 that may be as deep as 500 microns. Afterwards, the substrate is cleaned in a bath of HCl and $H_2O_2$ to remove residual etchant ions and then rinsed in de-ionized water for several minutes.

Figure 10:
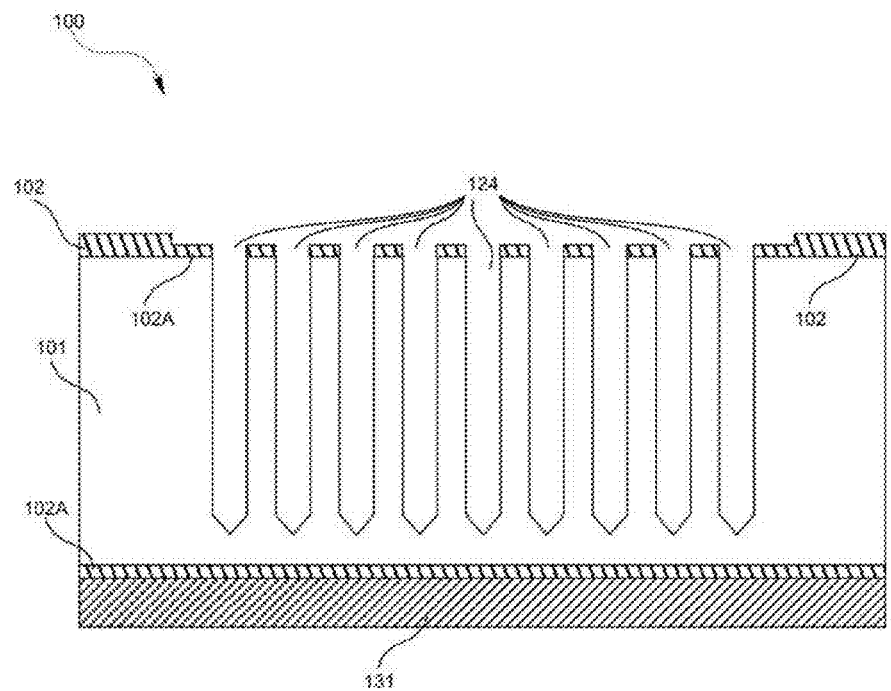

Referring to FIG. 10, a thick mask 131 is applied to the back side of substrate 101 and hardened. The mask 131 may be formed by negative photoresist, or the mask 131 may be formed by positive photoresist. Afterwards, substrate 101 is submerged in an etching solution to remove dielectric layer 102A on the front of the substrate 101 taking care not to remove the total amount of dielectric thickness represented by 102. Afterwards, the mask layer 131 is removed. The mask removal process may include a liquid chemical mask remover. The substrate 101 may then be cleaned in a gaseous plasma. For instance, the substrate 101 may be cleaned in an $O_2$ plasma for a duration between 30 minutes to 90 minutes. The substrate 101 is then cleaned to remove residual etchant residue. The substrate cleaning solution may consist of a combination of nitric acid ($HNO_3$), hydrofluoric acid HF, and water ($H_2O$). Afterwards, an additional clean may be used. For instance, the standard RCA clean may be used.

Figure 11:
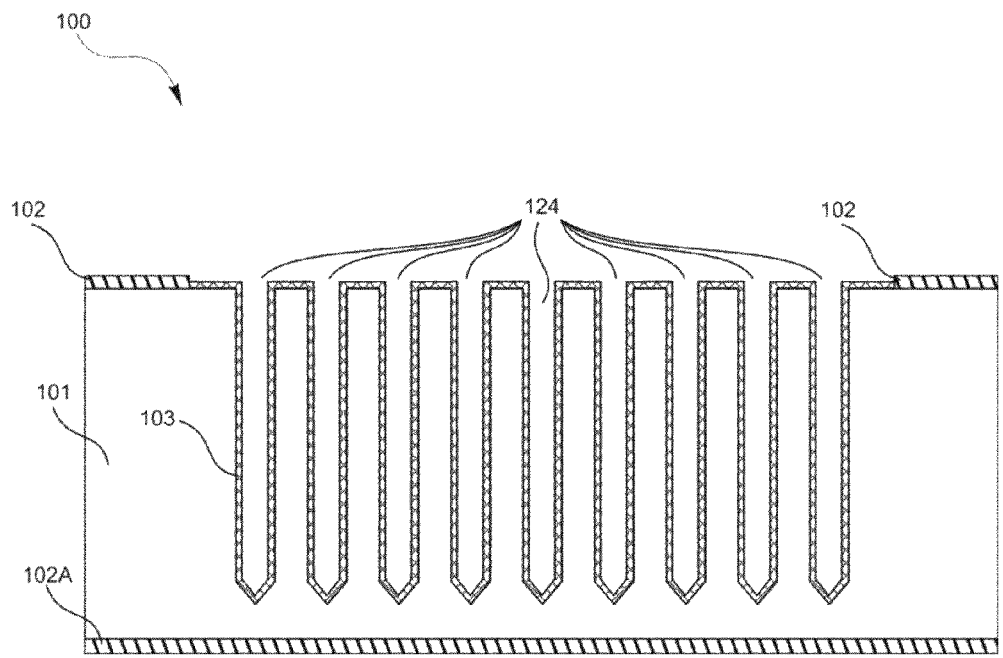

Referring to FIG. 11, the substrate 101 is inserted into a high temperature furnace and a dopant is introduced and diffused into the substrate 101 to form a conformal pn junction 103 on the surface of the exposed substrate regions, including the surface regions within the etched patterns 124. The introduced dopant may be a p-type dopant or the dopant may be an n-type dopant. The dopant source material may be a liquid source such as $BBr_3$ (p-type) or $POCl_3$ (n-type). Additionally, the dopant source material may be a solid source, such as BN (p-type) or $P_2O_5$ (n-type). The pn junction 103 thickness may be generally thin between 0.1 and 0.4 microns. Afterwards, the substrate is submerged in an etch solution to remove any oxide grown during the diffusion process. For example, a $SiO_2$ layer containing boron will form on the exposed Si surfaces during p-type diffusion. This step should remain short so as to not remove dielectric material 102. The pn junction 103 may also be partially-conformal, such that only a portion of the exposed substrate region is doped and diffused by way of a short diffusion-process time. In such a case, the oxide grown during the diffusion process will not be removed and will act as a passivation layer. This oxide isolates the surface states within the etched pattern 124 and prevents electrical shorting of the partially-conformal pn junction 103 to the bulk semiconductor substrate 101, thereby reducing surface leakage current of the junction.

Figure 12:
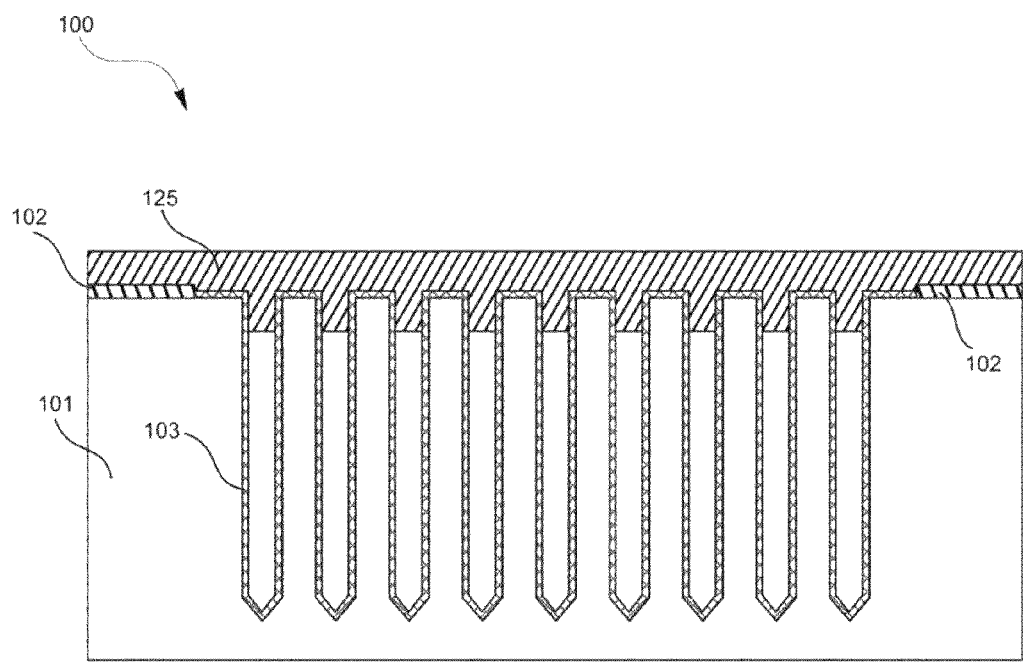

Referring to FIG. 12, a thick mask 125 is applied to the top side of the substrate 101. The mask 125 may be formed by negative photoresist, or the mask 125 may be formed by positive photoresist. Afterwards, substrate 101 is submerged in an etching solution to remove dielectric layer 102A on the back of the substrate 101. Afterwards, the mask layer 125 is removed. The mask removal process may include a liquid chemical mask remover. The substrate 101 may then be cleaned in a gaseous plasma. For instance, the substrate 101 may be cleaned in an $O_2$ plasma for a duration between 30 minutes to 90 minutes.

Figure 13:
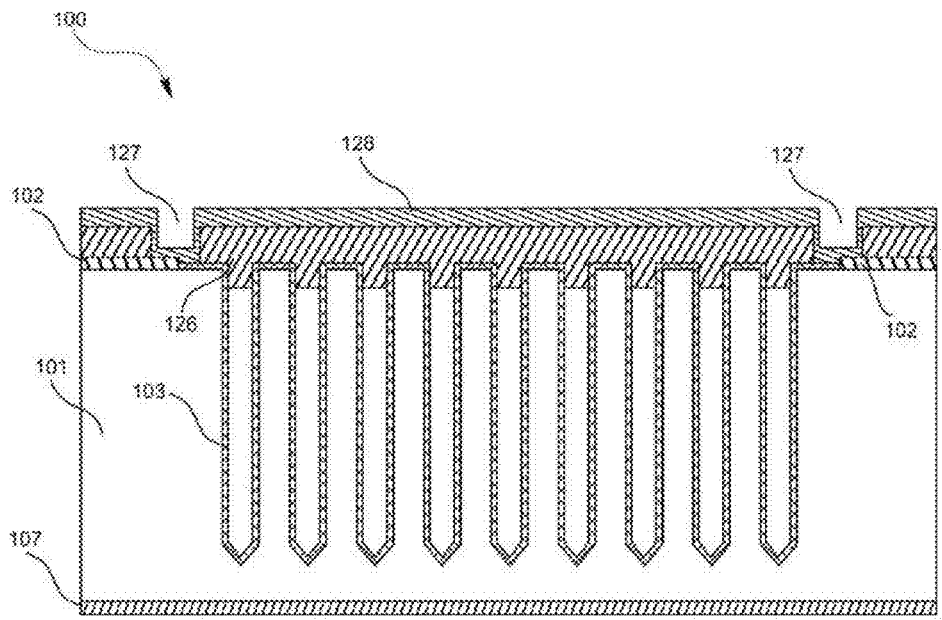

Referring to FIG. 13, a mask 126 is applied to the front side of the substrate 101 and developed to form a pattern to produce a window 127 for metallization. The mask 126 may be formed by negative photoresist, or the mask 126 may be formed by positive photoresist. Afterwards, the substrate 101 is submerged in an etching solution to remove residual contaminant native oxide. For instance, the substrate 101 may be submerged in BOE for two minutes. Afterwards, a metal 128 is applied to the top of the substrate 101. Afterwards, a metal 107 is applied to the bottom of the substrate. The metal may consist of a layered material such as Ti, W, Al, and Au. The metal may consist of a eutectic or alloy of Ti and W, such as Ti (10%) and W (90%). The metal thicknesses 128 and 107 may consist of layer thicknesses generally of 0.1 microns Ti/W alloy followed by 0.4 microns Al followed by 0.1 microns of Ti and then 0.1 microns of Au to protect the Al layer from oxidation.

Figure 14:
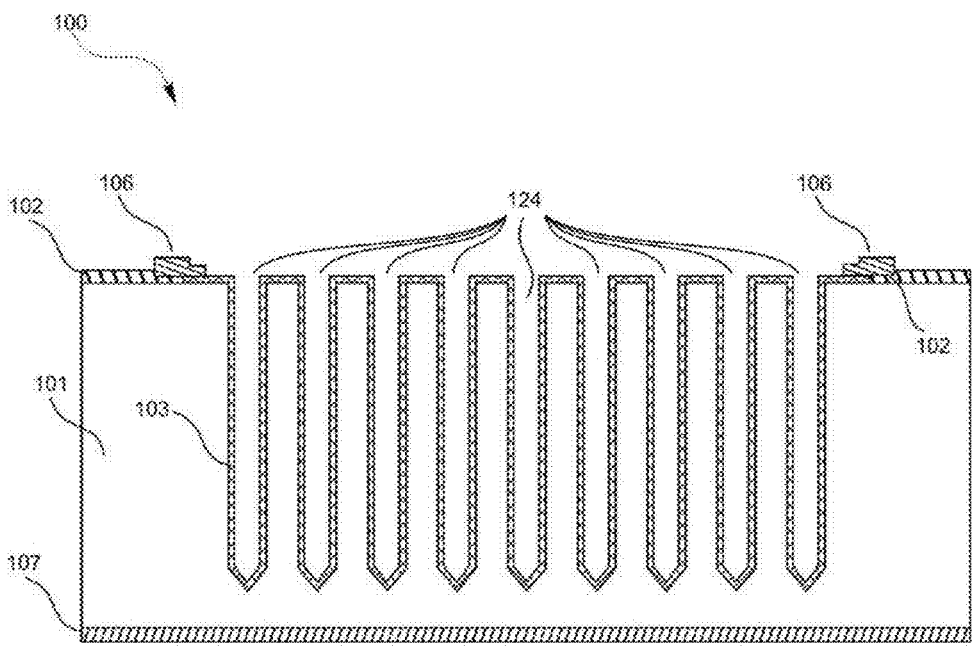

Referring to FIG. 14, the substrate is submerged in a solution to dissolve the mask 126 and liftoff undesired parts of metal layer 128. The end results leaves behind electrical metal contacts 106 on substrate 101.

Figure 15:
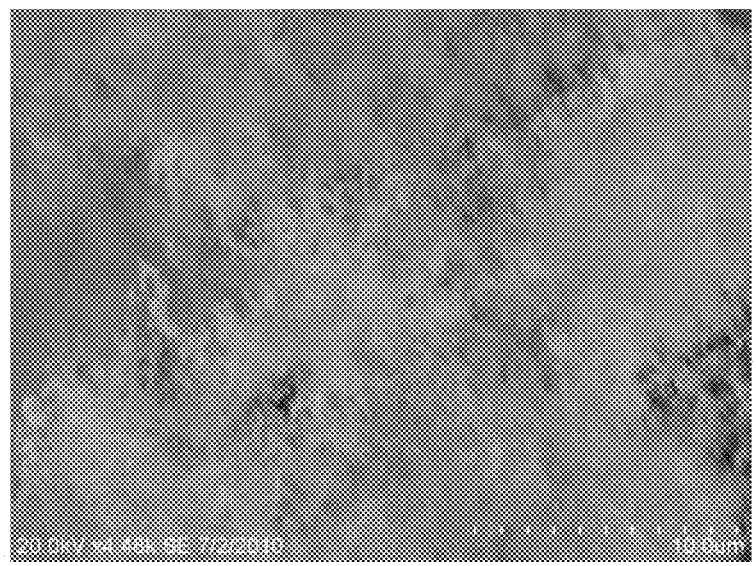
FIG. 15 is a photograph of nanoparticle $^6$LiF produced through the vapor-condensation method.

Referring now to FIG. 15, there is shown the formation of nanoparticle material whereupon the material has remained in nanoparticle form. With increased carrier gas flow velocity, the LiF nanoparticle material is given less time to coalesce into spheres, and therefore the size of the LiF-agglomerated nanoparticles are coherently reduced.

Figure 16:
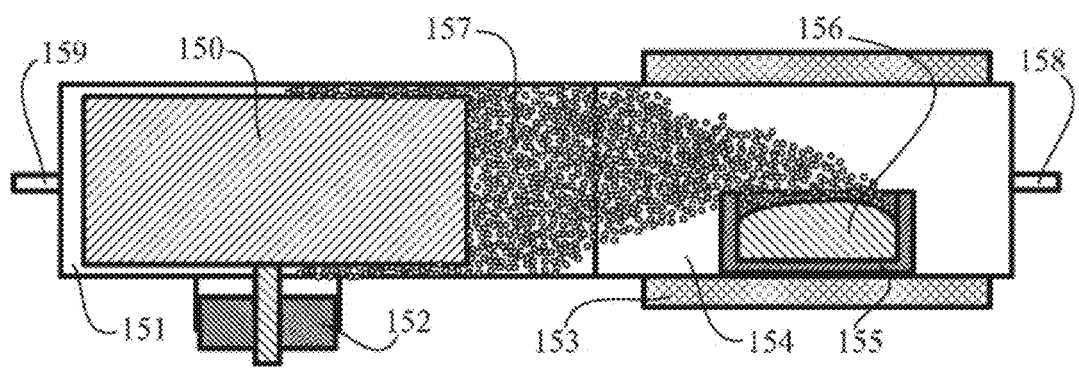
FIG. 16 is an illustration of the Thermal Vaporization Condensation (TVC) system. This system has three primary zones: the heating zone, where coarse LiF powder is melted and vaporized, cooling zone, where LiF vapor coagulates and condenses via thermophoretic forces on the walls of the furnace tube, and the electrostatic precipitator, where remaining particles are collected via a large electric field.

Referring now to FIG. 16, there is shown a schematic of the entire TVC system with primary components labeled.

The nanoparticle material may be a composition of Li, such as LiF, pure boron, or a compound of boron, such as pure boron carbide. A source 156 of neutron reactive material is placed in a crucible 155 inside a high-temperature furnace 154 and heated with heating elements 153 to the vaporization or sublimation temperature. The vaporization may occur at atmospheric pressure or in a vacuum, such as 150 mTorr by use of a vacuum pump. The slow evaporation of source 156 produces nano-sized vapor particles 157. The nanoparticle vapor 157 is transported down the furnace tube by an inert gas, which is introduced through the gas inlet 158, which may be argon or nitrogen. The nanoparticle vapor 157 typically attracts static charge while in motion. The nanoparticle vapor 157 is forced into the electrostatic precipitator, which consists of main parts anode 150, cathode 151, and separating insulator 152. The separating insulator 152 serves to prevent a short of the anode to the cathode and it serves to prevent gas leaks in the anode collection region. The voltage is placed across the anode 150 and cathode 151. The anode 150 is large inside the tube cathode 151 in order to constrict the gas flow through the electrostatic precipitator and ensure that the nanoparticles come in close vicinity of the cathode 121 and anode 150. The narrow flow region between the anode 150 and cathode 151 further serves to ensure that a high electric field is present between the cathode and anode. The statically charged nanoparticles in the vapor 157 is attracted to either the anode 150 or cathode 151, depending upon whether they are negatively charged or positively charged. The carrier gas exits the system through the outlet tube 159 or a vacuum pump that may be connected at the outlet.

A particular embodiment of the present invention uses LiF as the source material 156.

Figure 5:
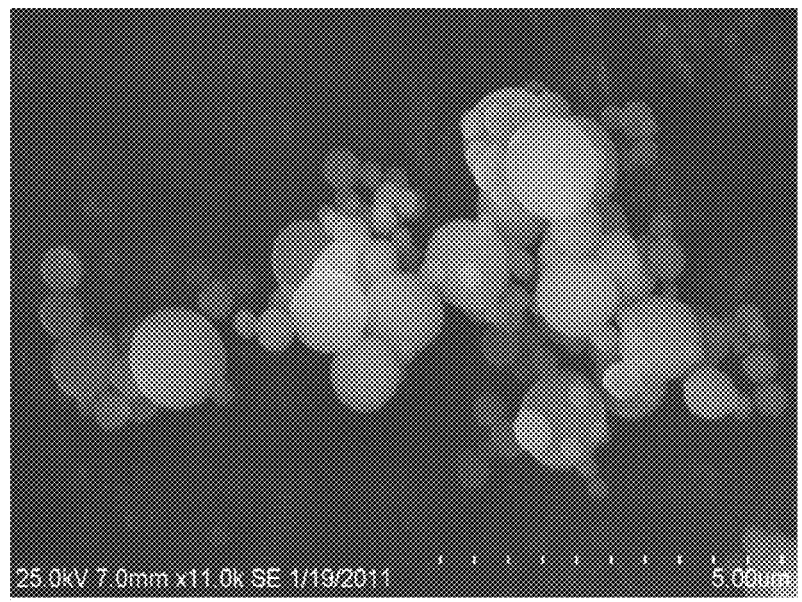
FIG. 5 is a photograph of fractals of LiF-agglomerated nanoparticles produced via LiF vapor condensation. The nanoparticle material has collected into a series of small spheres through electrostatic forces and then agglomerated spheres form into fractals of varying dimension.

As the LiF source 156 vaporizes, it is transported from the heating zone 154 via an inert carrier gas (e.g., argon or helium) to the thermophoretic cooling zone and/or electrostatic precipitator (ESP). Brownian motion forces the LiF vapor 157 to diffuse and travels with a bias in the direction of the carrier gas. During this motion, vapor particles follow aerosol dynamics and coagulate into larger and larger particles, forming spheres of LiF as shown in FIG. 5. Once the vapor particles cool sufficiently, the solid particles cease to coagulate and begin to conglomerate into fractals of varying orders due to Van der Waals forces, also shown in FIG. 5. During this phase, the fractals follow the dynamics of fractal agglomerates and begin to settle onto the surface wall of the furnace tube. This settling is caused by thermophoretic forces and occurs only soon after the heating zone where the temperature gradient is the greatest.

The velocity of a LiF nanoparticle, due to the thermophoretic forces, is described by the kinetic theory of gasses, $$c_t = \frac{-3v\nabla T}{4(1+\pi\alpha/8)T}, \quad (d_p \ll l_p), \qquad \text{(Equation 1)}$$

where $c_t$ the thermophoretic velocity, varies based on the temperature of the carrier gas T, the kinematic viscosity of the gas v, and the accommodation coefficient $\alpha$, and holds true for all agglomerates whose diameter $d_p$ is much smaller than the mean free path of the gas $l_p$. As the LiF vapor exits the heating zone, thermophoresis forces the agglomerated particle to the surface of the tube where they cool rapidly. Therefore, the size of the agglomerated spheres can be controlled by reducing the vaporization rate or increasing the carrier gas flow rate and temperature to increase the particles velocity through the furnace and, consequently, reducing the amount of coalesced material on an individual spherical particle.

Figure 17:
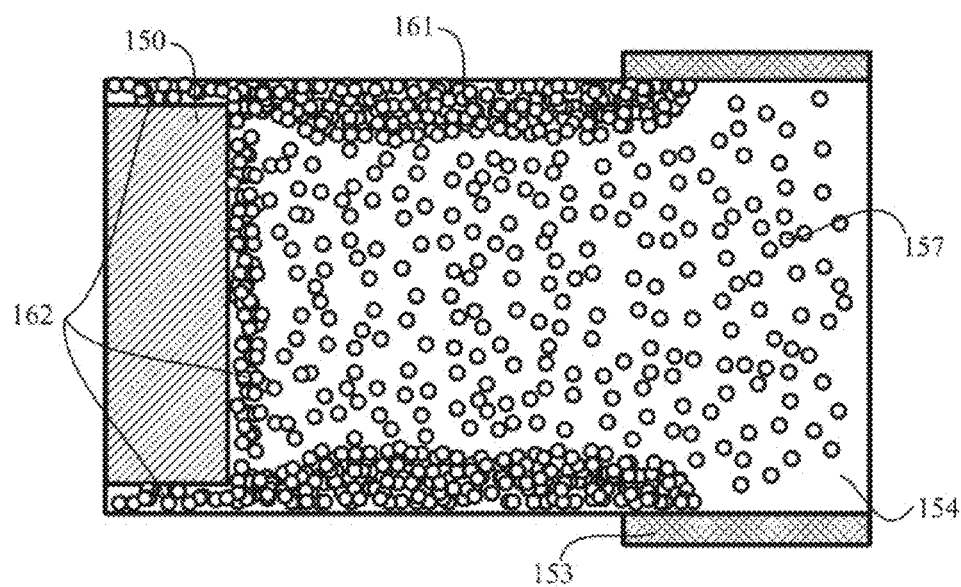
FIG. 17 is an illustration of the process by which the LiF vapor is carried from the heating zone to the cooling zone. Thermophoretic forces urge the freshly cooled LiF particles to deposit onto the relatively cold walls of the furnace tube.

Referring now to FIG. 17, there is shown a portion of the Thermal Vaporization Condensation TVC system that illustrates the accumulation of nanopowder 161 in the thermophoretic deposition zone. Depicted is a preferred embodiment of the invention that utilizes LiF as the neutron reactive source material 156, where the LiF vapor 157 is carried from the heating zone to the cooling zone. Thermophoretic forces urge the freshly cooled LiF particles 161 to deposit onto the relatively cold walls of the furnace tube 161. As the LiF nano-fractals move further down the apparatus, particles pick up charge from the furnace tube. This buildup of charge on the particles makes it possible for electrostatic condensation 162 at the electrostatic precipitator (ESP). Overall, nanoparticles are deposited through thermophorectic forces 161 and through electrostatic forces 162.

Figure 18:
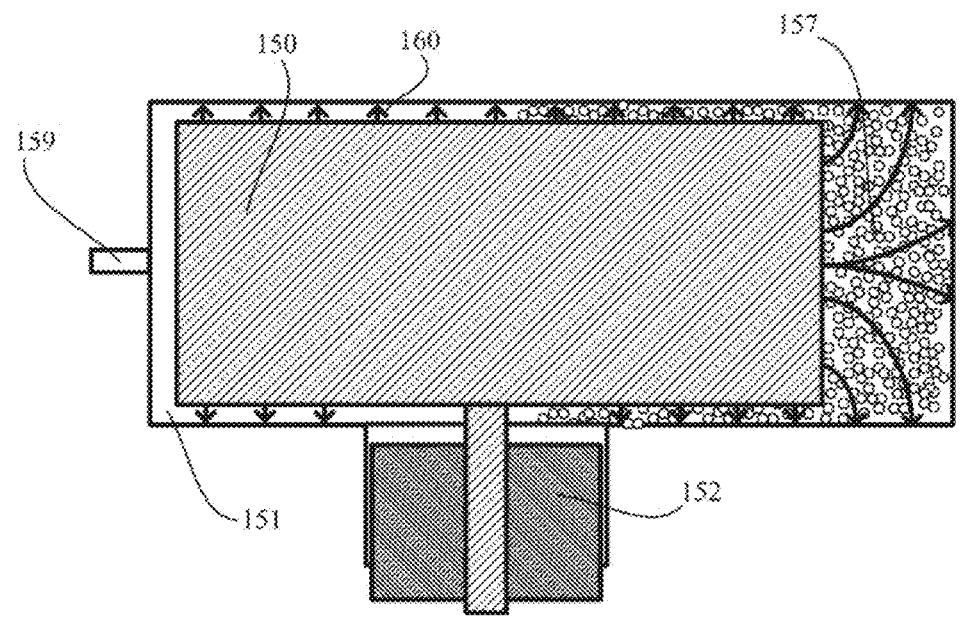
FIG. 18 is an illustration of the electrostatic precipitator (ESP) is a means of nano-powder collection for the Thermal Vaporization Condensation (TVC) system; the non-uniform regions of the electric field are used to improve collection of the neutrally charged fractals through forces on dipoles; the uniform regions are used to forcibly collect fractals that have picked up charge from the furnace tube.

Referring to FIG. 18, there is shown the electrostatic precipitator (ESP), which serves as a means of nano-powder collection for the Thermal Vaporization Condensation (TVC) system. The non-uniform regions of the electric field are used to improve collection of the neutrally charged fractals through forces on dipoles. The uniform regions are used to forcibly collect fractals that have picked up charge from the furnace tube. The ESP has a large potential applied to it, on the order of +3000 volts. This potential, coupled with the high dielectric constant of the inert carrier gas and the small gap between the anode 150 and cathode 151 of the device, produces an extremely strong electric field. This electric potential field 160 collects statically charged nanoparticles in the vapor 157 in two ways. Firstly, any excess charge picked up by nanoparticle fractals from the furnace tube will be affected by the electric field and be force to the furnace wall. The second means of nanoparticle collection from the ESP is how it affects particles with an overall neutral charge. For instance, in a preferred embodiment of the invention that uses LiF as the source material 156, fractals or individual spheres of nano-LiF without charge will still form a natural dipole due to internal Van der Waals forces. Any dipole that passes through a non-uniform electric field will feel a force in one direction and again be forced into the sidewall of the furnace tube. Any remaining material that is able to pass through the ESP is sent through the exhaust tube 159 into an atmospheric gas-lock bubbler. The remaining nanoparticles are safely trapped in a gas-lock solution, such as water.

The usefulness of being able to create nanoparticle LiF is not limited to MSND thermal neutron detectors. There is potential for its application in scintillators, particularly liquid scintillators, as a dispersed neutron converting material. Similar work has shown the particle size can be tuned, such that under UV illumination the photon is wavelength downshifted to a characteristically longer wavelength photon. Based on this invention, a scintillation photon in a solid or liquid scintillator can be wavelength shifted to better match a photocathode for a photomultiplier tube or better couple to a solid-state diode detector. Other advantages of using nanoparticle quantum dots (QDs) as a scintillation or a wavelength shifting mechanism over, or in conjunction with, fluorescent dyes is to improve light collection efficiency by reducing self-absorption, to reduce non-radiative exciton recombination, and to decrease the decay-time of the induced luminescence by removing the slower multi-state luminescent dye with nanoparticle direct band-gap QD fluorescent emission.

Previously, the simplest method for backfilling microstructured semiconductor devices was to gently deposit the powder by hand or by using a brush to coax the powder into the trenches mechanically. Although this process is simple and inexpensive, it is inefficient and often ineffective at completely filling high aspect-ratio and exceedingly deep microstructures. Using the by-hand method of material deposition, powder can be pressed into each device with a pressure of approximately 100 kPa (~15 psi). Unfortunately, due to the unevenness of the by-hand-force application, it is not uncommon for silicon microstructures to be broken during this process or for packing densities to vary across both a single detector element and the entire silicon wafer. This method also commonly leaves voids in the LiF filler material within the trenches. Additionally, each device must be attended to separately when pressed by hand, making large production runs difficult. An improved means for applying a much larger and more uniform force on the LiF backfill material, and in addition, a method to batch process the backfill of the microstructures, is to use a centrifuge to deposit the LiF.

Figure 19:
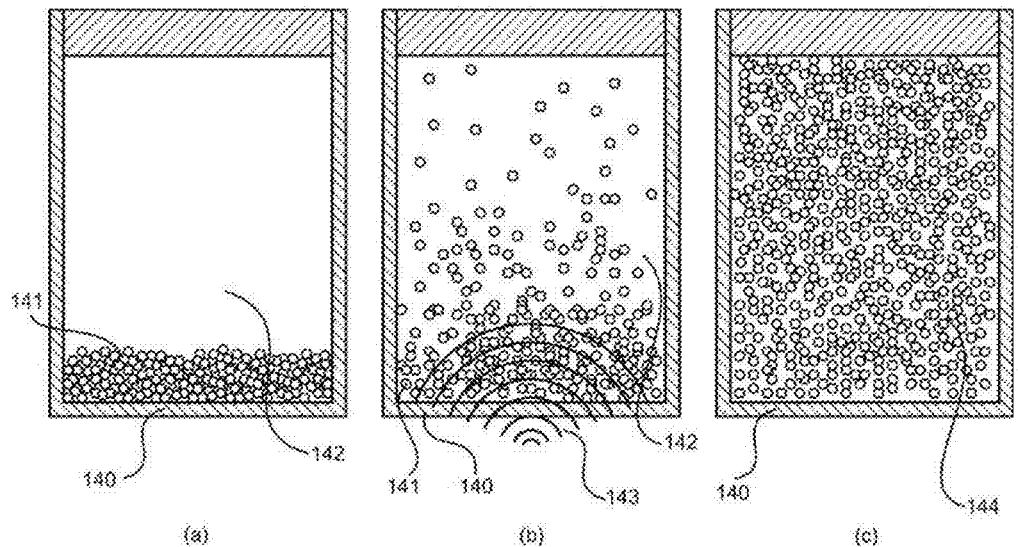
FIG. 19 is a progressive illustration of the process by which the LiF powder is dispersed into alcohol; powder is poured into the container of alcohol and is agitated with ultrasonic waves until complete dispersion is obtained.

Shown now in FIG. 19 are illustrations showing the progressive steps to produce a colloidal solution of nanoparticles. In preparation for the neutron conversion material deposition, a colloid solution 144 is produced of nanoparticle powder 141 suspended in a solution of organic solvent 142. The nano-sized powder is dropped into a high strength bottle 140 filled with an organic solvent 142. The solvent 142 may be a mixture of alcohol, such as methyl alcohol, and a weak solvent, such as hydrogen peroxide. The bottle is then placed into an ultrasonic vibrator and exposed to ultrasonic waves 143 as shown in FIG. 19. The waves disperse the nanoparticle powder 141 into the solvent 142. The solvent acts to suspend the powder almost indefinitely in a colloidal solution 144. It should be noted that the powder 141 is not dissolved by the solvent 142. Alternatives to this method include probe-type ultrasonic vibrators, where an ultrasonic probe is placed in the bottle of solvent and nanoparticles. Other similar solvents, such as isopropyl alcohol, ethyl alcohol, and acetone, may be used in place of methyl alcohol. The nano-sized material 141 may be LiF powder or boron powder. This method of suspending the nano-sized LiF powder produces uniform powder dispersion, thereby, producing uniform material deposition in later steps of the semiconductor process.

Figure 20:
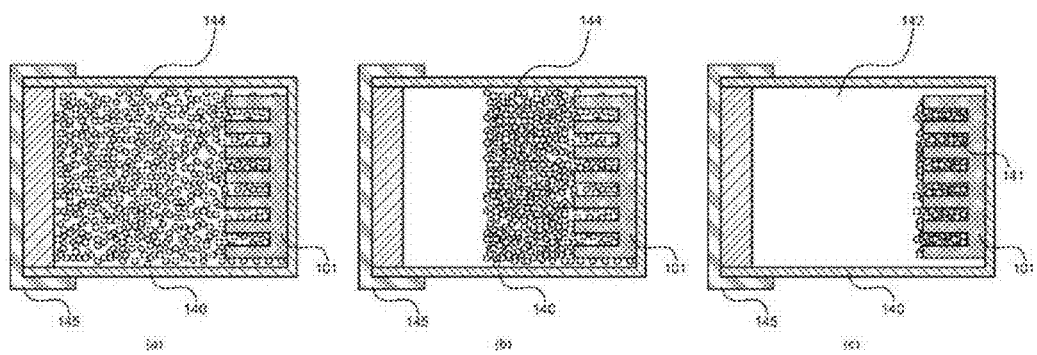
FIG. 20 is a progressive illustration of centrifugal LiF deposition in semiconductor microstructures via LiF-nanoparticle powder colloidal-suspension in alcohol; this method offers improvement over physically pressing the LiF-nanoparticle powder into the microstructures; the illustrated dimensions of the diode inside the bottle have been exaggerated for effect.

Shown now in FIG. 20 are illustrations showing the progressive steps to fill microscopic cavities. An etched substrate 101 placed at the bottom of a container 140 filled with the dispersed neutron conversion material 144. The dispersed neutron conversion material 144 may be a colloidal solution containing LiF or a colloidal solution containing boron. The substrate 101 is supported by an aluminum plate or other similar type of plate that is inert within the isopropyl alcohol while offering structural support for the substrate 101. The entire system, including bottle 140, colloid solution 144, and substrate 101, is placed into a low-speed high-capacity centrifuge. As the system is rotated, centrifugal forces act on the suspended LiF powder 141 and force it down towards the substrate 101, as illustrated in FIG. 20b. The cavities are forcibly backfilled with nanoparticle powder by spinning the container and colloid in the centrifuge at high rpm as shown in FIG. 20c. The velocity at which the centrifuge is operated may be in the range between 3000 and 6000 rpm. The time for the spinning operation may last for 15 minutes to 2 hours.

Through this backfill method, the suspended LiF nanoparticle powder settles into the microstructures of the silicon wafer and is compressed under the centrifugal pressure felt at the surface of the microstructured silicon, depicted in FIG. 20, which is described by Bernoulli's equation with a varying centripetal force field, $\alpha_c(r)$, with no angular acceleration, $$P = \rho a_c(r) \Delta x, \quad \text{(Equation 2)}$$
$$= \int_{r_{Top}}^{r_{Device}} \rho a_c(r) dr$$
$$= \rho \int_{r_{Top}}^{r_{Device}} (w^2 r) dr$$
$$= \rho w^2 \int_{r_{Top}}^{r_{Device}} r dr,$$
$$= \rho w^2 \left[\frac{1}{2} r^2\right]_{r_{Top}}^{r_{Device}}$$
$$= \frac{1}{2} \rho w^2 [(r_{Device})^2 - (r_{Top})^2],$$

where the hydrostatic pressure at the substrate surface 101, P, varies with the rotational velocity of the sample, w, the density of the colloid suspending solution, $\rho$, the radial distance from the center of the rotor to the top of the fluid, $r_{Top}$, and distance, $r_{Device}$, the distance from the center of the rotor to the substrate 101. Specifically, a microstructured silicon wafer rotated at 5000 rpm. Thereby, producing a pressure at the substrate 101 surface of approximately 7.25 MPa (~1050 psi), which is a multiple of 70 increase previous methods, according to Eq. 2. Additionally, the pressure applied to the substrate 101 is uniform across the silicon wafer. The centrifugal method for deposition occurs in hundreds of individual devices simultaneously. Due to the inert low-temperature deposition advantages of the centrifugal LiF backfilling method, i.e., no chemical, electrical, and structural integrity damage of the silicon material, the centrifugal deposition method is found to be the superior method for backfilling LiF cavities in the detector structures 100 over previous methods.

Figure 21:
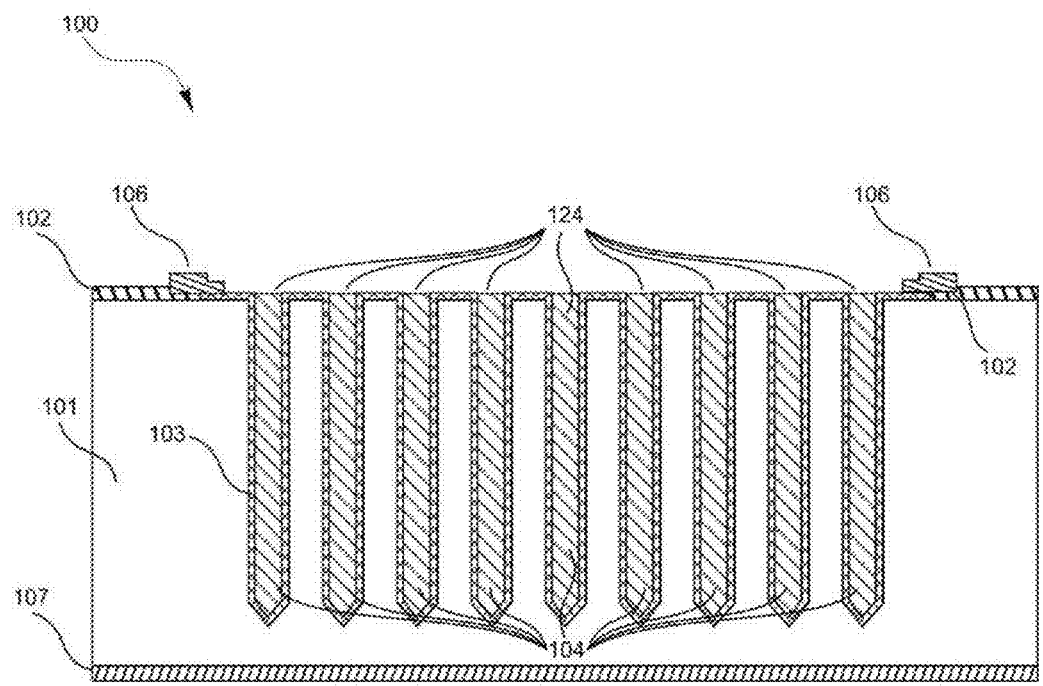
FIG. 21 is a schematic illustration of a cross section view of a semiconductor process according to an embodiment of the present invention.

Referring to FIG. 21, shown is a substrate 101 of an embodiment of the present neutron detector invention 100 after having neutron reactive nanoparticles 104 forced into cavities 124. The nanoparticle 104 material may be LiF or boron.

Choice of the dispersion solution chemistry for the neutron reactive material colloidal solution is very important when using the centrifuge backfilling method. One such solution implemented for ultrasonic colloidal dispersion of the neutron reactive material included isopropyl alcohol. Other lower viscosity solutions were tried, e.g., acetone and methyl alcohol. Although the velocity of the particle in the lower viscosity dispersions under centrifugal forces was increased, the isotropic dispersion-state of the colloidal dissipated fairly quickly, leaving little-time to transfer the colloid to the centrifuge containers holding the wafers to be backfilled. Furthermore, the neutron reactive powder-material was only loosely held in the microstructures of the wafers. As such, the powder was not securely held in the trenches and could be knocked out with little force of vibration or gas-flow. To remedy this problem, a weak solvent was chosen for the dispersion solution for the neutron reactive material, e.g., water, as in the case for $^6$LiF. When the whole MSND wafer was centrifugally-backfilled with a weak-solvent as the dispersion solution (or a part of the dispersion solution) and the MSND wafer is dried through solution evaporation, the powder particles fuse together into a rigid mass. As such, the powder is held more firmly in the trenches.

A caveat to the use of a weak solvent for the dispersion solution is that it changes the adsorption (sticking) coefficient. In the case of LiF, with water as the weak-solvent in the dispersion solution, it dramatically increases the adsorption coefficient. As such, the microstructure openings are sealed-off before the voids can be filled.

Figure 22:
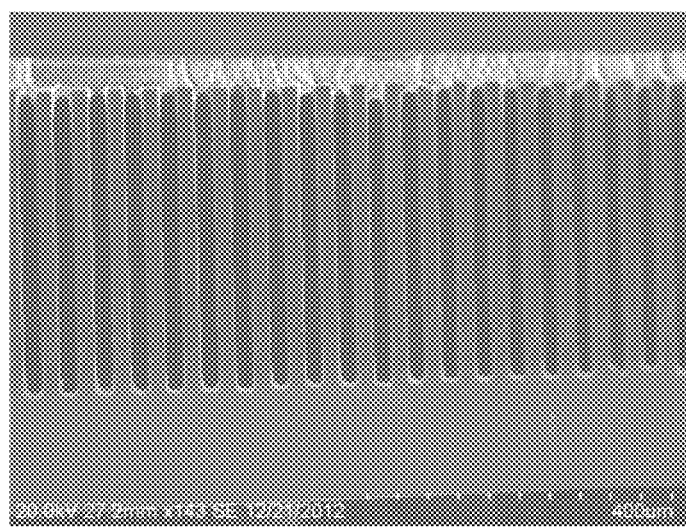
FIG. 22 is a SEM photograph of LiF centrifugal backfilling with 1:1 ratio of water to acetone as the LiF dispersion solution, with water acting as the weak-solvent; the openings of the trenches are closed off almost immediately during the centrifugal deposition, i.e., there is little LiF powder in the bottom of the trenches.

Referring to FIG. 22, there is shown the case in which a weak solvent solution of water combined with acetone at a ratio of 1:1 has coalesced the LiF particles such that they stuck together and did not efficiently enter the etched trenches during the centrifugal process.

Figure 22A:
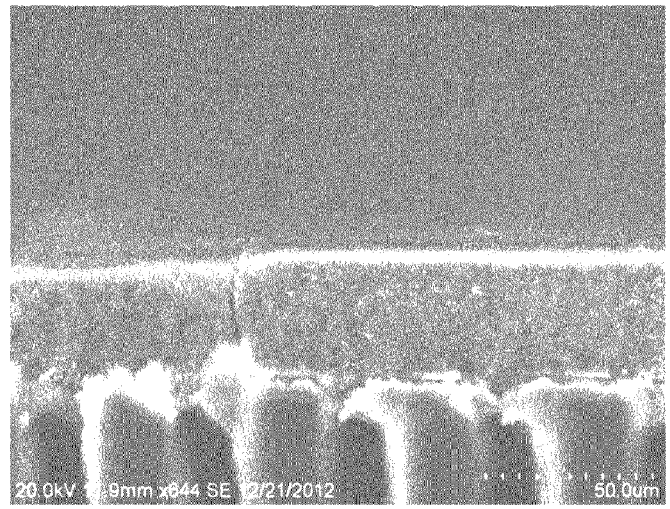
FIG. 22A is a SEM photograph of LiF centrifugal backfilling with 1:1 ratio of water to acetone as the LiF dispersion solution, with water acting as the weak-solvent; the openings of the trenches are closed off almost immediately during the centrifugal deposition, i.e., there is little LiF powder in the bottom of the trenches.

Referring to FIG. 22A, there is shown another view of the case in which a weak solvent solution of water combined with acetone at a ratio of 1:1 has coalesced the LiF particles such that they stuck together and did not efficiently enter the etched trenches during the centrifugal process.

Figure 23:
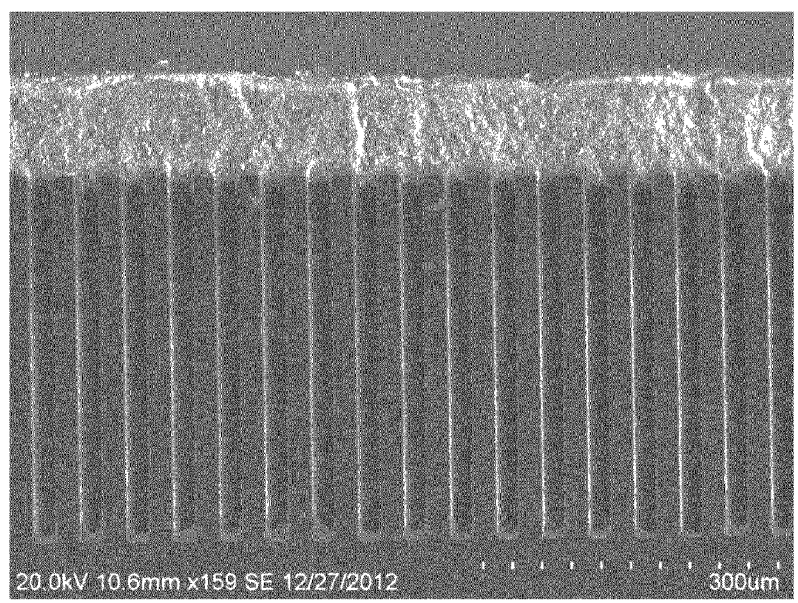
FIG. 23 is a SEM photograph of centrifugal backfilling with 1:1 ratio of water to isopropyl alcohol as the LiF dispersion solution, with water acting as the weak-solvent; the openings of the trenches are closed off almost immediately during the centrifugal deposition, i.e., there is little LiF powder in the bottom of the trenches.

Referring to FIG. 23, there is shown the case in which a weak solvent solution of water combined with isopropyl alcohol at a ratio of 1:1 has coalesced the LiF particles such that they stuck together and did not efficiently enter the etched trenches during the centrifugal process.

A successful weak-solvent for the dispersion solution that dramatically decreases the adsorption coefficient of the centrifugally-deposited particle is aqueous hydrogen peroxide. Stabilized hydrogen peroxide further decreases the adsorption coefficient of the particle, e.g., Acros Organics hydrogen-peroxide, 35 wt. % solution in water, stabilized, which also shows improved colloidal-dispersion stabilization time. Some proprietary stabilized hydrogen-peroxide blends use chelating compounds, which are beneficial in both reducing the adsorption coefficient and increasing colloidal-dispersion stabilization time. To further improve the dispersion solution for use in the centrifuge deposition process, acetone or methyl alcohol can be included to reduce the viscosity of the hydrogen peroxide dispersion solution, thereby, reducing the drag force of the particle and increasing its velocity to increase the density-compaction of the powder in the microstructure voids.

Figure 1:
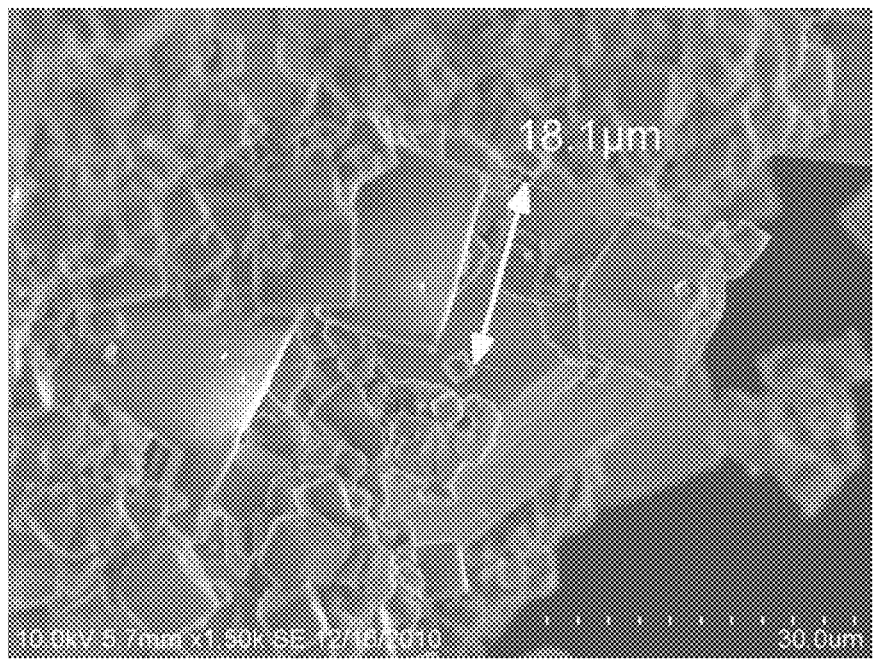
FIG. 1 is a photograph of micrometer-sized $^6$LiF produced either commercially or through laboratory titration of LiOH and HF; crystal sizes can range from sub-micron to tens of microns wide.
Figure 2:
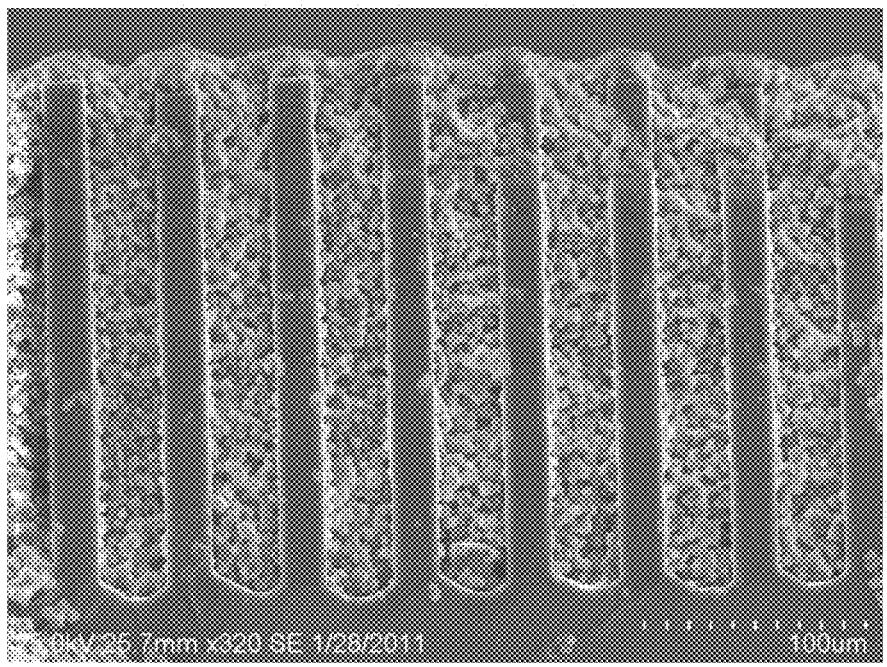
FIG. 2 is a photograph of solution-precipitated LiF powder backfilled into straight 250-micron deep trenches; the coarse material does not completely fill the trenches of the devices and therefore reduces detection efficiency.
Figure 3:
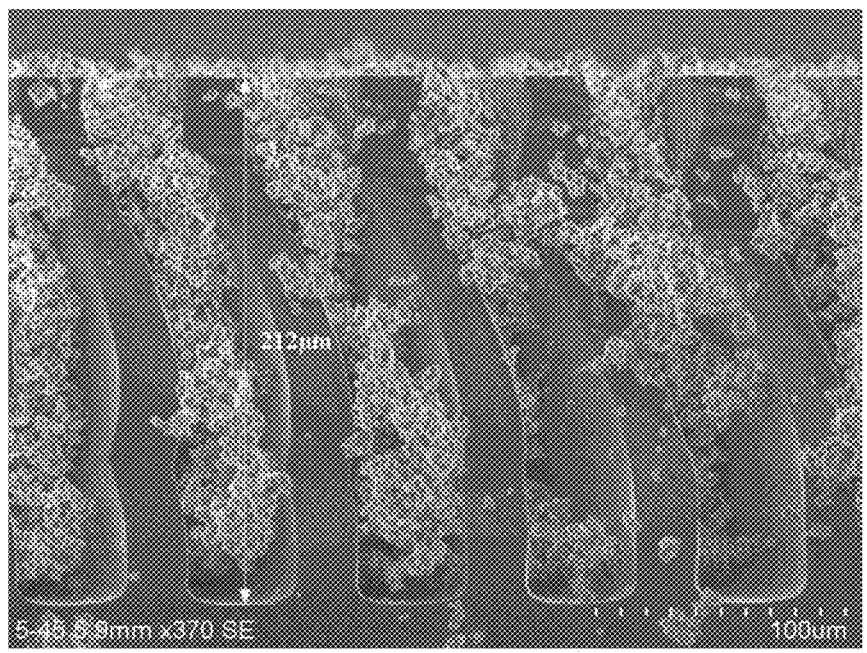
FIG. 3 is a photograph of solution-precipitated LiF powder backfilled into sinusoidal 212-micron deep trenches; the coarse material does not completely fill the trenches of the devices and therefore reduces detection efficiency.
Figure 4:
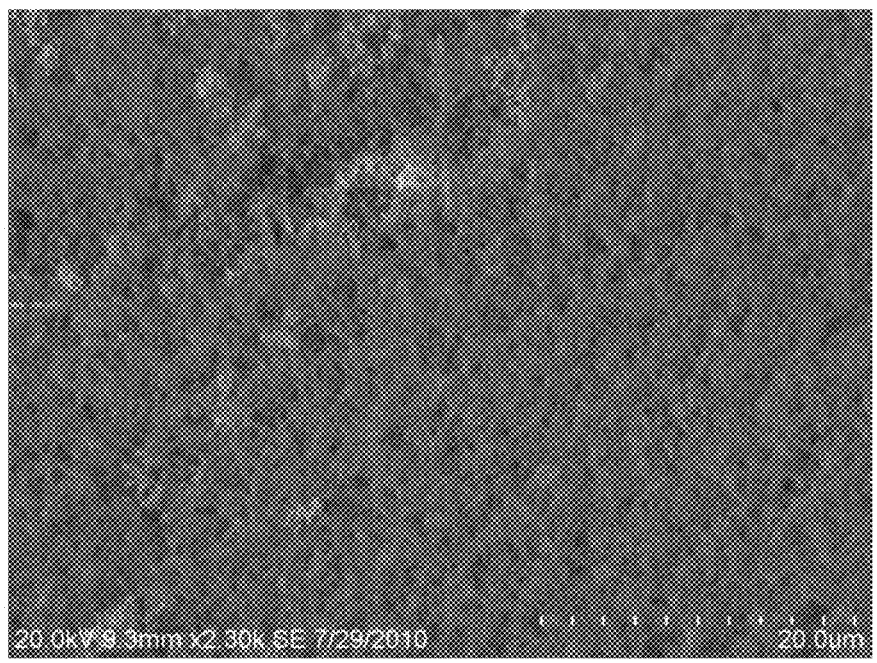
FIG. 4 is a photograph of LiF-agglomerated nanoparticles produced via LiF vapor condensation; with increased carrier gas flow velocity, the LiF nanoparticle material is given less time to coalesce into spheres, and therefore the size of the LiF-agglomerated nanoparticles are coherently reduced.
Figure 24:
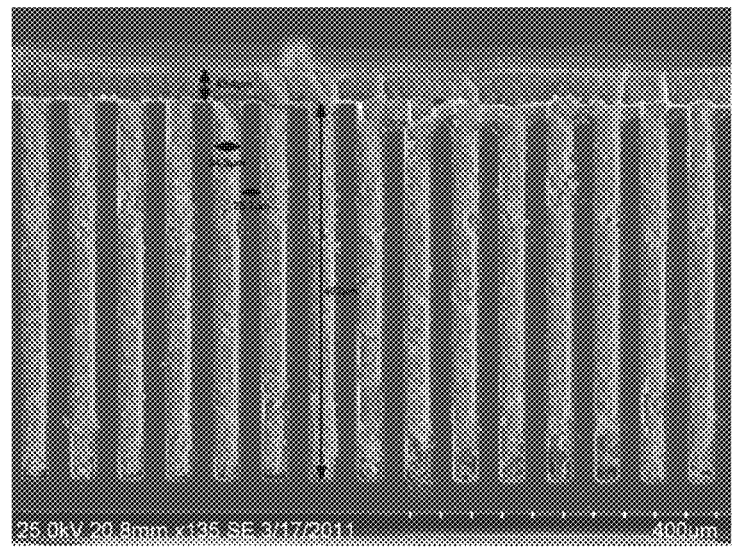
FIG. 24 is a SEM photograph of a centrifugally backfilled semiconductor with, approximately, 500 micron deep trenches backfilled with LiF nanoparticle powder in high aspect-ratio KOH wet-etched straight trench microstructures; the SEM photograph shows centrifugal backfilling with 1:5 ratio of stabilized aqueous hydrogen peroxide 35 wt. % to methyl alcohol as the LiF dispersion solution, with aqueous hydrogen peroxide acting as the weak-solvent.

Referring to FIG. 24, shown is a scanning electron microscope (SEM) photograph of cavities of a cross section of a preferred embodiment of invention 100 of FIG. 21, each cavity being, approximately, 35 microns wide and, approximately, 500 microns deep. The cavities were centrifugally backfilled with LiF nanoparticles as described as a preferred embodiment of this invention. It can be seen that there are no voids present in the backfilled cavities, a clear improvement over the backfilled cavities shown in FIG. 1, FIG. 2 and FIG. 3.

Once the centrifuge deposition process is complete, the residual solution in the centrifuge container is drained and the backfilled wafer is removed from the base of the container. The wafer is left to dry in ambient air at room temperature for six hours. Fusion of the neutron reactive powder-material takes place during the evaporation of the weak solvent, as such, the powder in the microstructure voids are locked in place. It is important to slowly dry the dispersion solution from the backfill material; else, expansion voids will form from rapid gas expansion.

Figure 25:
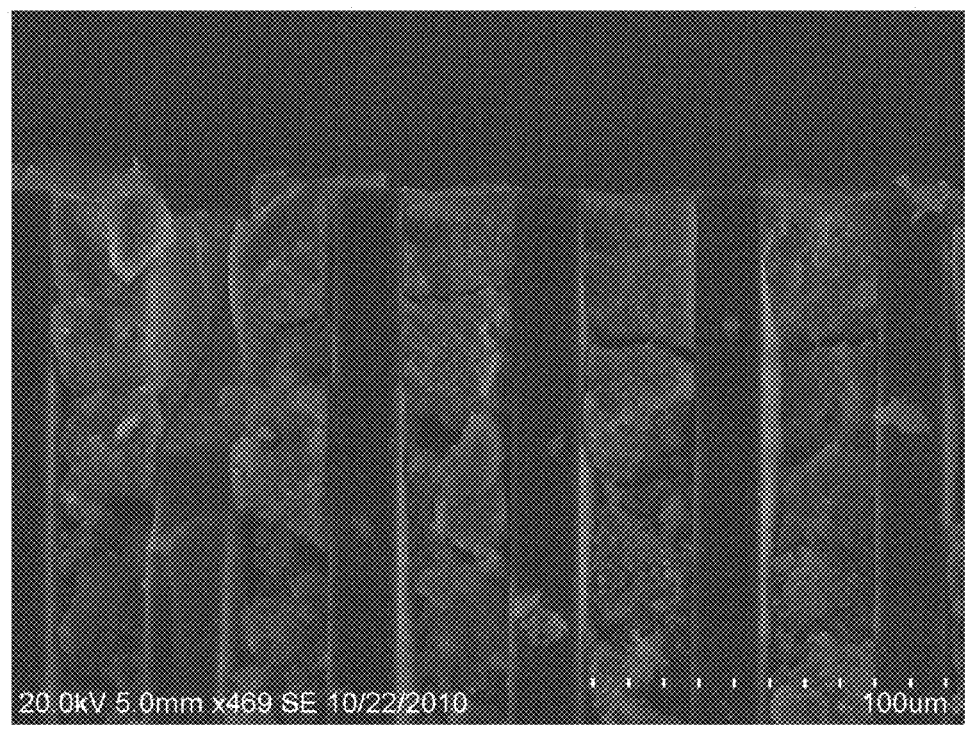
FIG. 25 is a SEM photograph of centrifugal backfilling with 1:5 ratio of stabilized aqueous hydrogen peroxide 35 wt. % to methyl alcohol as the nano-sized LiF dispersion solution, with aqueous hydrogen peroxide acting as the weak-solvent; the substrate backfill material was dried at room temperature; the powder is in solid-form, evidenced in the left-most trench and the crack along the upper-part of the backfilled trenches, which was created during the cleaving of the microstructured substrate to facilitate viewing of the backfill material.

Referring to FIG. 25, there is shown the result of centrifugal backfilling with 1:5 ratio of stabilized aqueous hydrogen peroxide 35 wt. % to methyl alcohol as the nano-sized LiF dispersion solution, with aqueous hydrogen peroxide acting as the weak-solvent. The substrate backfill material was dried at room temperature. Notice that the powder is in solid-form, evidenced in the left-most trench and the crack along the upper-part of the backfilled trenches, which was created during the cleaving of the microstructured substrate to facilitate viewing of the backfill material.

Figure 26:
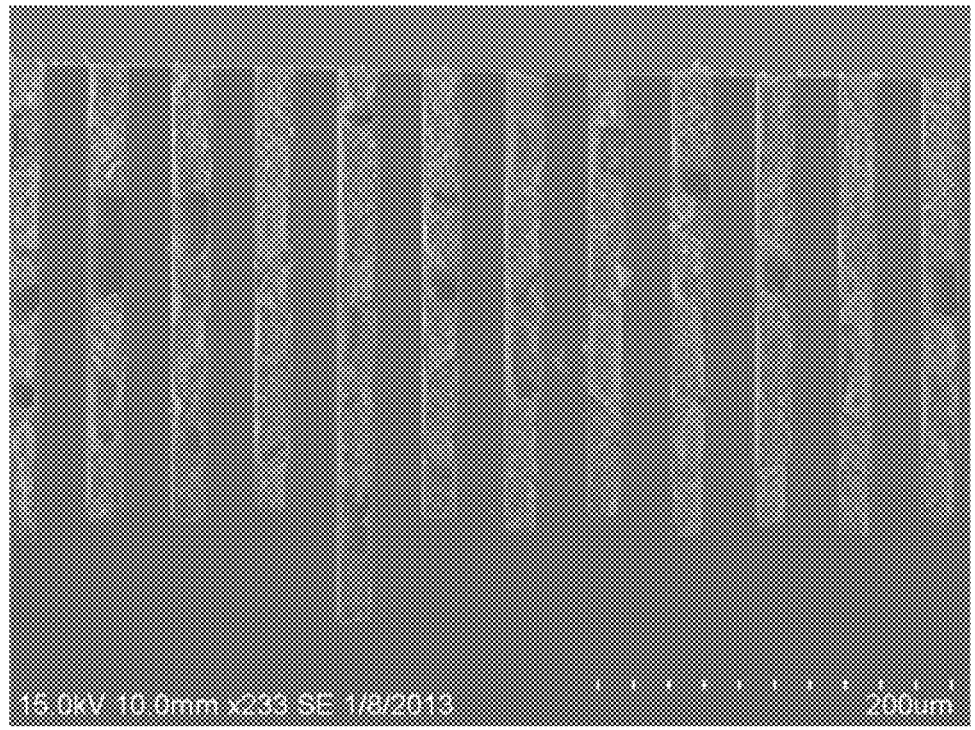
FIG. 26 is a SEM photograph of centrifugal backfilling with 1:5 ratio of stabilized aqueous hydrogen peroxide 35 wt. % to methyl alcohol as the nano-sized LiF dispersion solution, with aqueous hydrogen peroxide acting as the weak-solvent; the substrate backfill material was dried at 150° C.; the powder is in solid-form, but, there are expansion-voids formed from the dispersion solution evaporating too quickly.

Referring to FIG. 26, there is shown the result of centrifugal backfilling with 1:5 ratio of stabilized aqueous hydrogen peroxide 35 wt. % to methyl alcohol as the nano-sized LiF dispersion solution, with aqueous hydrogen peroxide acting as the weak-solvent. The substrate backfill material was dried at 150° C. Notice that the powder is in solid-form, but, there are expansion-voids formed from the dispersion solution evaporating too quickly.

To ensure complete and uniform fill of the microstructure voids, excess neutron reactive powder is used beyond the amount required to fill the voids. Consequently, a film is left on the top surface of the wafer. Because the film is composed of fused powder, it is somewhat easily removed by polishing or scraping with a razorblade. Once the film is removed, the wafer is coated with an epoxy spray coating to hermetically seal the microstructures and prevent the dicing solution from penetrating the backfilled microstructures during the dicing process.

Figure 27:
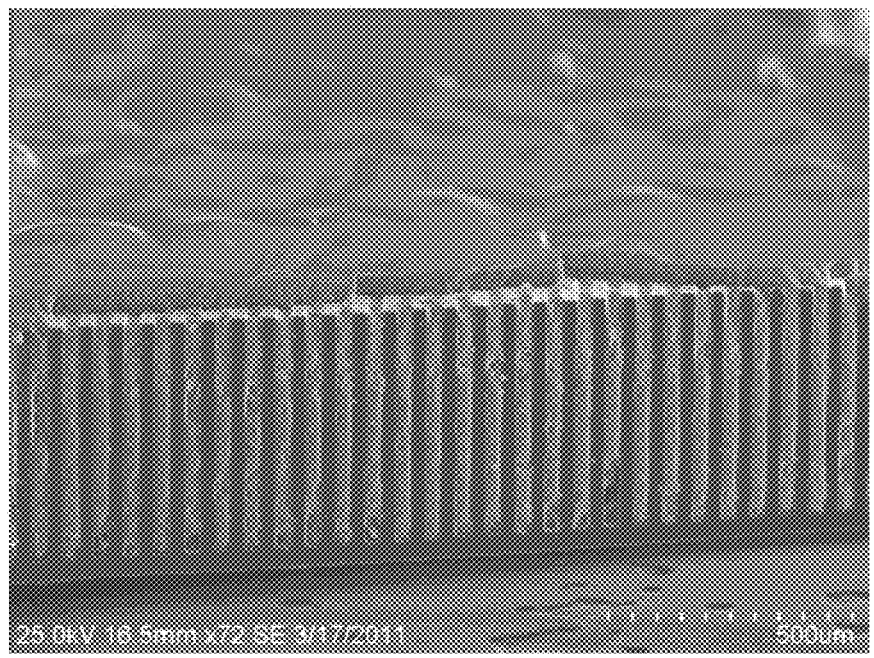
FIG. 27 is a photograph of a centrifugally backfilled semiconductor with, approximately, 500 micron deep trenches backfilled with LiF nanoparticle powder in high aspect-ratio KOH wet-etched straight trench microstructures.

Referring to FIG. 27, shown is a scanning electron microscope (SEM) photograph of cavities of a cross section of a preferred embodiment of invention 100 of FIG. 21, each cavity being, approximately, 35 microns wide and, approximately, 500 microns deep. The cavities were centrifugally backfilled with LiF nanoparticles as described as a preferred embodiment of this invention. It can be seen that there are no voids present in the backfilled cavities, a clear improvement over the backfilled cavities shown in FIG. 1, FIG. 2 and FIG. 3.

Figure 28:
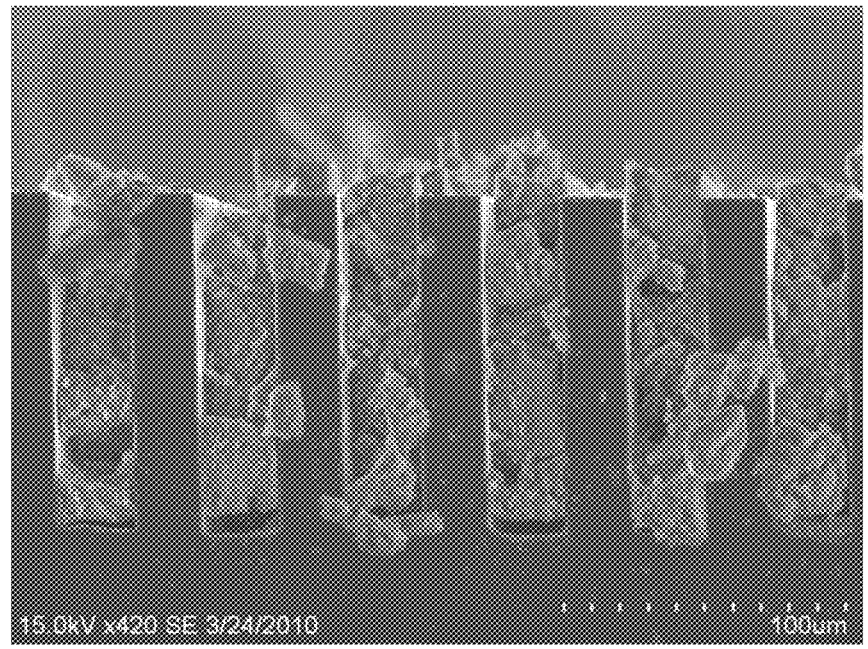
FIG. 28 is a photograph of a centrifugally backfilled semiconductor with 100 micron deep trenches backfilled with LiF nanoparticle powder in high aspect-ratio KOH wet-etched straight trench microstructures.

Referring to FIG. 28, shown is a scanning electron microscope (SEM) photograph of cavities of a cross section of a preferred embodiment of invention 100 of FIG. 21, each cavity being, approximately, 25 microns wide and, approximately, 100 microns deep. The cavities were centrifugally backfilled with LiF nanoparticles as described as a preferred embodiment of this invention. It can be seen that there are no voids present in the backfilled cavities, a clear improvement over the backfilled cavities shown in FIG. 1, FIG. 2 and FIG. 3.

Figure 29:
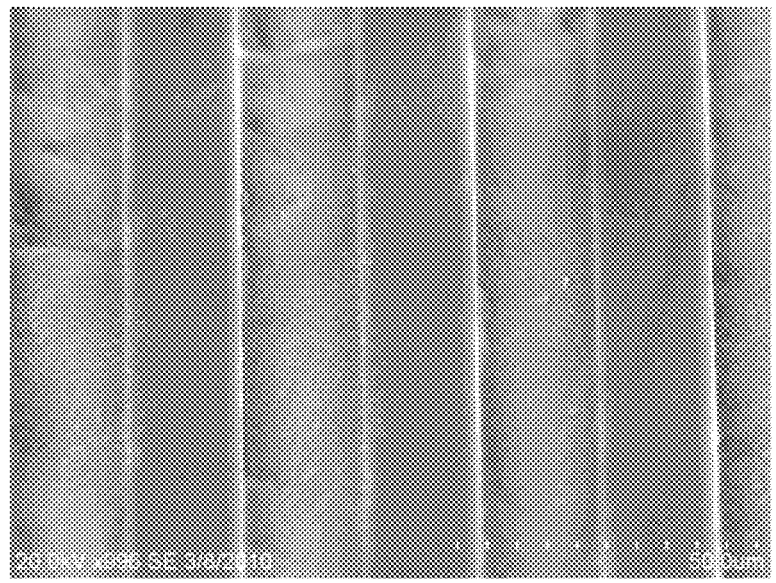
FIG. 29 is a top-view photograph of the 20 micron wide trenches backfilled with LiF nanopowder.

Referring to FIG. 29, shown is a scanning electron microscope (SEM) photograph of a top view of cavities of a preferred embodiment of invention 100 of FIG. 21, each cavity being, approximately, 20 microns wide. The cavities were centrifugally backfilled with LiF nanoparticles as described as a preferred embodiment of this invention. It can be seen that there are no voids present in the backfilled cavities, a clear improvement over the backfilled cavities shown in FIG. 1, FIG. 2 and FIG. 3.

Figure 30:
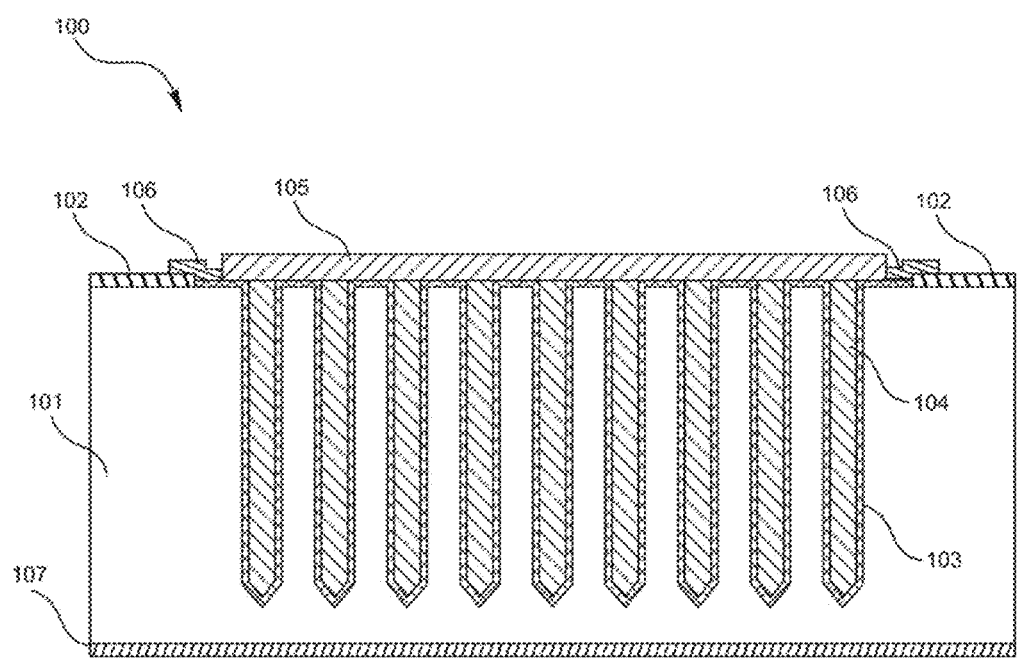
FIG. 30 is a schematic illustration of a cross section view of a semiconductor process according to an embodiment of the present invention.

Referring to FIG. 30, shown is a substrate 101 of an embodiment of the present neutron detector invention 100 after having neutron reactive nanoparticles 104 forced into cavities 124. The nanoparticle 104 material may be LiF or boron. A final deposition of neutron reactive material 105 has been deposited upon the front of the substrate 101. The final deposition of neutron reactive material may be deposited with physical vapor deposition. Examples including electron-beam evaporation and RF sputtering. The final deposited material may be LiF or boron.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of making a neutron detector, the method comprising:
    providing a particle-detecting substrate having a surface and a plurality of cavities extending into the substrate from the surface; and
    filling the plurality of cavities with a neutron-responsive material, the step of filling including the step of centrifuging nanoparticles of the neutron-responsive material with the substrate for a time and at a rotational velocity sufficient to backfill the cavities with the nanoparticles, the material being responsive to neutrons absorbed thereby for releasing ionizing radiation reaction products.

2. The method of claim 1, wherein the step of providing includes a step of forming a dielectric layer and a patterned hard mask layer sequentially on the substrate.

3. The method of claim 2, wherein the step of providing includes a step of removing a portion of the dielectric layer with an etch to form an opening to expose the substrate.

4. The method of claim 3, wherein the step of providing includes a step of submerging the substrate into a directionally orientated, semiconductor etching solution to produce the cavities.

5. The method as claimed in claim 4, wherein the step of providing includes a step of introducing dopant impurities into the cavities to produce a rectifying junction in the cavities.

6. The method as claimed in claim 5, wherein the junction is a pn junction.

7. The method as claimed in claim 3, wherein the step of providing includes a step of introducing metallic materials or metallic alloys into the cavities to produce a Schottky barrier rectifying junction in the cavities.

8. The method as claimed in claim 3, wherein the step of providing includes a step of introducing dopant impurities into the cavities to produce an ohmic contact in the cavities.

9. The method as claimed in claim 1, wherein the substrate is a semiconductor substrate.

10. The method as claimed in claim 9, wherein the detector is a microstructured semiconductor neutron detector.

11. The method as claimed in claim 1, wherein the nanoparticles are suspended in a colloidal solution during the step of centrifuging.

12. The method as claimed in claim 1, wherein the cavities are deep anisotropic cavities.

13. The method of making a neutron detector, the method including providing a particle-detecting substrate having a surface and a plurality of cavities extending into the substrate from the surface, and filling the plurality of cavities with a neutron-responsive material, the material being responsive to neutrons absorbed thereby for releasing ionizing radiation reaction products, an improvement comprising:
the step of filling includes the step of centrifuging nanoparticles of the neutron-responsive material with the substrate for a time and at a rotational velocity sufficient to backfill the cavities with the nanoparticles.

14. The method of claim 13, wherein the step of providing includes a step of forming a dielectric layer and a patterned hard mask layer sequentially on the substrate.

15. The method of claim 14, wherein the step of providing includes a step of removing a portion of the dielectric layer with an etch to form an opening to expose the substrate.

16. The method of claim 15, wherein the step of providing includes a step of submerging the substrate into a directionally orientated, semiconductor etching solution to produce the cavities.

17. The method as claimed in claim 16, wherein the step of providing includes a step of introducing dopant impurities into the cavities to produce a rectifying junction in the cavities.

18. The method as claimed in claim 17, wherein the junction is a pn junction.

19. The method as claimed in claim 16, wherein the step of providing includes a step of introducing metallic materials or metallic alloys into the cavities to produce a Schottky barrier rectifying junction in the cavities.

20. The method as claimed in claim 16, wherein the step of providing includes a step of introducing dopant impurities into the cavities to produce an ohmic contact in the cavities.

21. The method as claimed in claim 13, wherein the substrate is a semiconductor substrate.

22. The method as claimed in claim 21, wherein the detector is a microstructured semiconductor neutron detector.

23. The method as claimed in claim 13, wherein the nanoparticles are suspended in a colloidal solution during the step of centrifuging.

24. The method as claimed in claim 13, wherein the cavities are deep anisotropic cavities.

* * * * *